(12) United States Patent
Lin et al.

(10) Patent No.: US 12,266,525 B2
(45) Date of Patent: *****Apr. 1, 2025

(54) PHOTOMASK PELLICLE INCLUDING NETWORK OF NANOWIRES AND METHOD OF FORMING THE SAME

(71) Applicant: TAIWAN SEMICONDUCTOR MANUFACTURING COMPANY LTD., Hsinchu (TW)

(72) Inventors: Yun-Yue Lin, Hsinchu (TW); Chen-Chieh Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/426,387

(22) Filed: Jan. 30, 2024

(65) Prior Publication Data

US 2024/0177994 A1 May 30, 2024

Related U.S. Application Data

(63) Continuation of application No. 17/351,219, filed on Jun. 17, 2021, now Pat. No. 11,923,196.

(60) Provisional application No. 63/156,734, filed on Mar. 4, 2021.

(51) Int. Cl.
*H01L 21/02* (2006.01)
*G03F 1/64* (2012.01)
*H01L 21/033* (2006.01)
*H01L 29/06* (2006.01)

(52) U.S. Cl.
CPC .......... *H01L 21/02603* (2013.01); *G03F 1/64* (2013.01); *H01L 21/02444* (2013.01); *H01L 21/0332* (2013.01); *H01L 21/0337* (2013.01); *H01L 29/0669* (2013.01)

(58) Field of Classification Search
CPC ......... H01L 21/02436; H01L 21/02439; H01L 21/02444; H01L 21/02601; H01L 21/02603; H01L 21/02606; H01L 21/0332; H01L 21/0337; H01L 29/0669; H01L 29/0673; G03F 1/48; G03F 1/62; G03F 1/64

See application file for complete search history.

(56) References Cited

U.S. PATENT DOCUMENTS

2017/0038676 A1* 2/2017 Jung .......................... G03F 1/62

\* cited by examiner

*Primary Examiner* — Cheung Lee
(74) *Attorney, Agent, or Firm* — WPAT LAW; Anthony King

(57) ABSTRACT

A first capping layer is deposited over a substrate. A first capping layer is deposited over a substrate. A network of nanowires is grown over the first capping layer. A second capping layer is deposited over the network of nanowires. The substrate is etched to expose the first capping layer. The first capping layer and the second capping layer are thinned around the nanowires to form a coating on the nanowires.

20 Claims, 30 Drawing Sheets

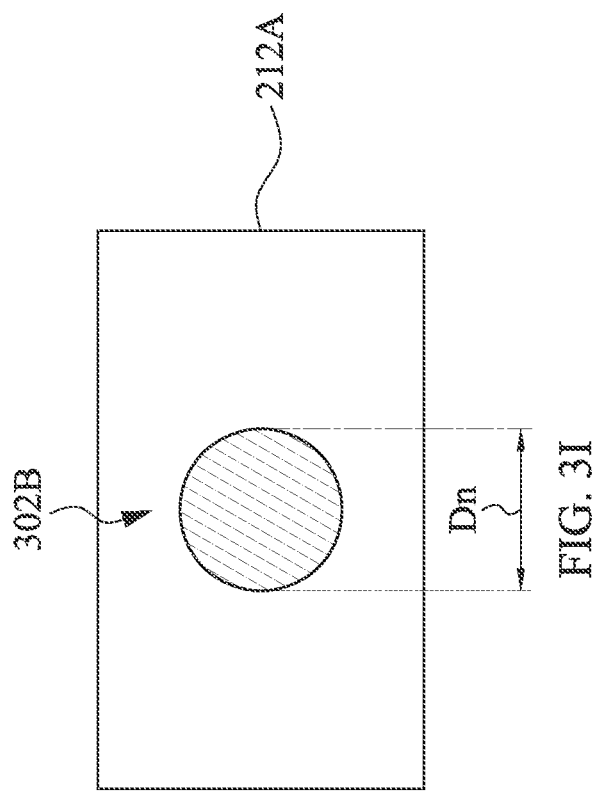
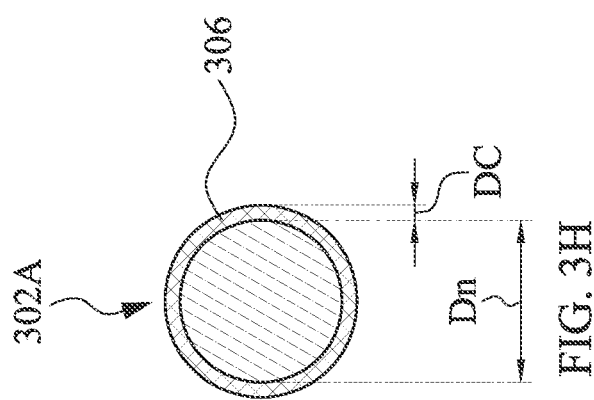

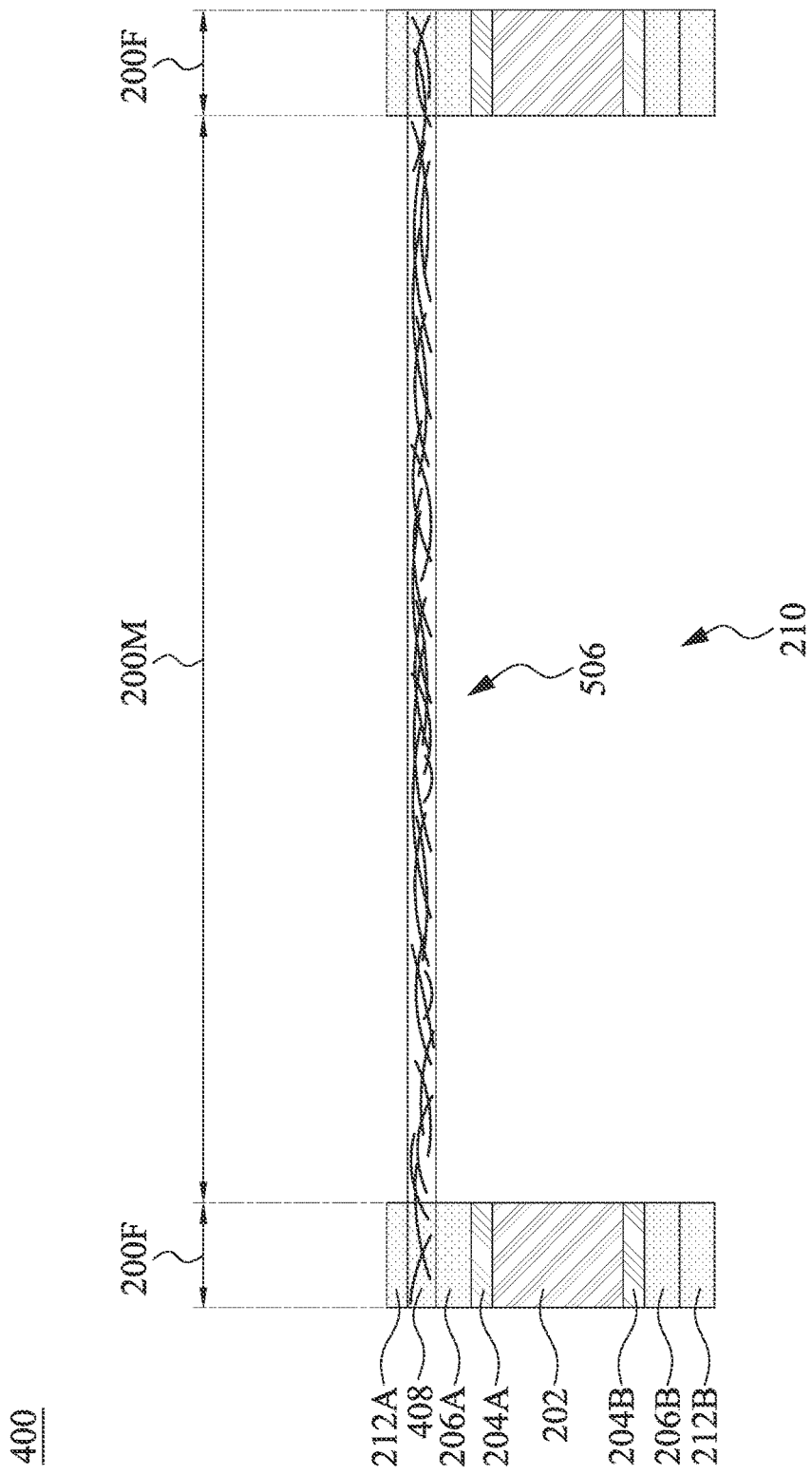

PHOTOMASK PELLICLE INCLUDING NETWORK OF NANOWIRES AND METHOD OF FORMING THE SAME

PRIORITY CLAIM AND CROSS-REFERENCE

This application is a continuation application of U.S. Non-provisional application Ser. No. 17/351,219 filed Jun. 17, 2021 and claims priority to U.S. provisional application Ser. No. 63/156,734 filed Mar. 4, 2021, the disclosure of which is hereby incorporated by reference in its entirety.

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power, advanced photolithography technologies, e.g., extreme ultraviolet (EUV) photolithography, have been investigated as approaches to manufacturing semiconductor devices with a relatively small line width, e.g., 10 nm or less. EUV photolithography employs a photomask assembly to control irradiation of a substrate under EUV radiation so as to transfer a circuit pattern on a photomask of the photomask assembly to the substrate. During the EUV photolithography operation, the photomask is protected from particle contamination by a photomask pellicle in the photomask assembly.

While existing photolithography techniques have improved, they still fail to meet requirements in many aspects. For example, the robustness and performance of the photomask pellicle still need to be improved to meet the needs of EUV photolithography.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A, 3B, 3C, 3D, 3E, 3F, 3G, 3H, 3I, 3J, 3K and 3L are perspective views and cross-sectional views of nanowires in intermediate stages of the method shown in FIGS. 2A to 2L, in accordance with some embodiments of the present disclosure.

FIGS. 4A to 4C are cross-sectional views of intermediate stages of a method of manufacturing a photomask pellicle, in accordance with some embodiments of the present disclosure.

DETAILED DESCRIPTION

Figure 1:
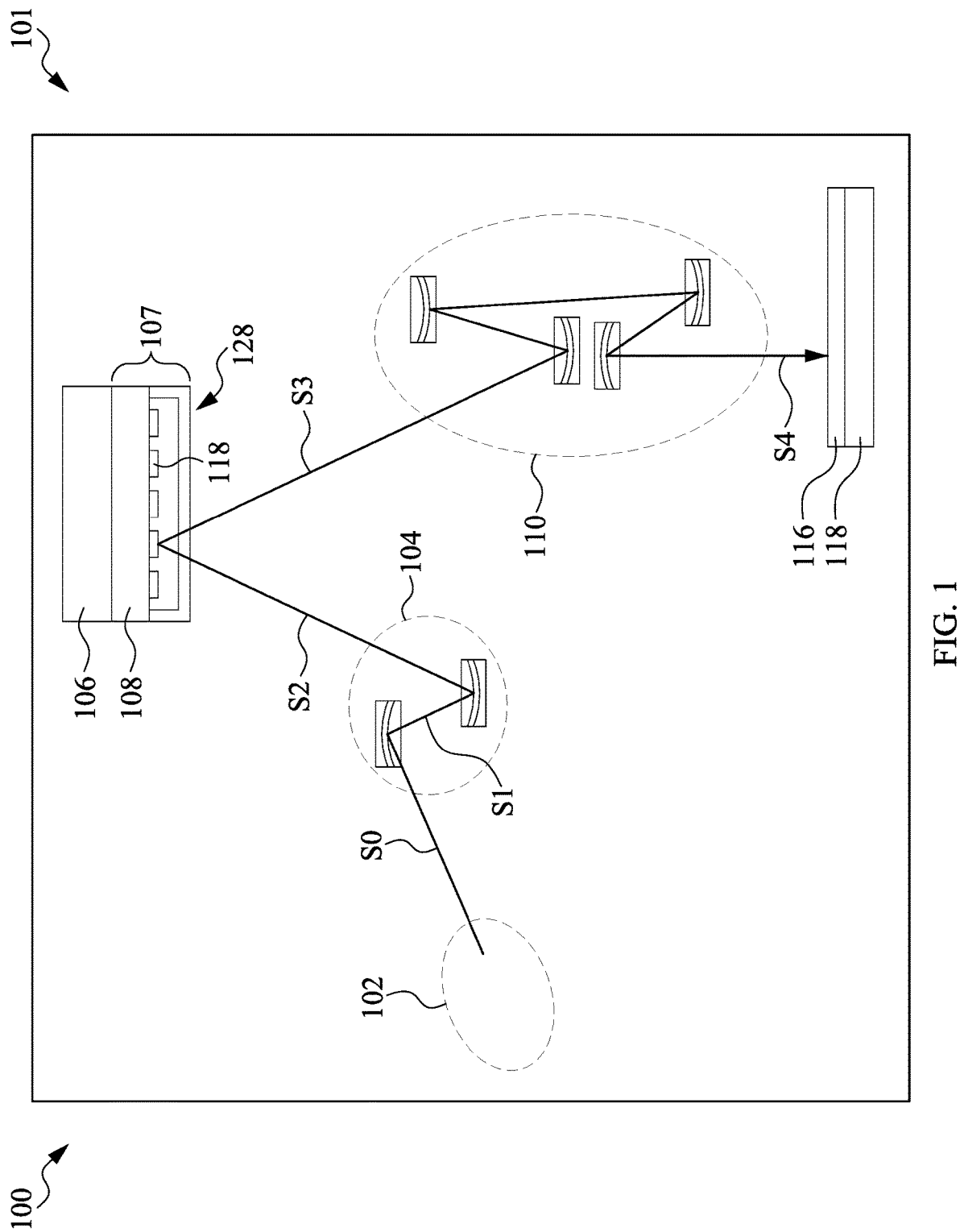
FIG. 1 is a schematic diagram of a photolithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "photomask," "reticle" and "mask" used throughout the present disclosure refer to a device used in a photolithography system, in which a patterned image according to a circuit pattern is formed on a substrate plate.

The substrate plate may be transparent. The image of the circuit pattern on the photomask is transferred to a workpiece through a radiation source of the photolithography system. Photolithography radiation emitted from the radiation source is incident on the workpiece via the photomask in a transmissive or reflective manner.

A photomask used in EUV photolithography is typically a reflective-type mask that includes a circuit pattern formed thereon and is used to transfer the circuit pattern onto the workpiece, such as a wafer, through reflection of a patterned EUV radiation from a light-reflective layer of the photomask during the EUV photolithography operation.

The performance of EUV photolithography is sensitive to the integrity of the photomask. If an undesirable foreign material, such as a contaminant or particle, is adhered to the photomask, such material may hinder transmission of the EUV light, and thus the circuit pattern may not be successfully transferred to the workpiece. As such, a photomask pellicle (referred to herein as a pellicle) is adopted to protect the photomask from the particle or the contaminant. The pellicle generally includes a membrane over the photomask, in which the membrane is transparent to EUV light and functions well under a high-temperature environment of the EUV photolithography tool. However, existing materials and configurations of the membrane, which is based on a solid thin film, may not fulfill various requirements of EUV lithography, e.g., high transmittance of EUV light, efficient heat dissipation, adequate membrane stress, environment-durable material, etc.

The present disclosure provides a pellicle and a method of forming the pellicle. In the proposed scheme, the pellicle includes a membrane that is formed of a network of nanowires with a high EUV transmittance rate while being capable of protecting the photomask from foreign particles. Further, the proposed membrane structure provides sufficient membrane rigidity and ductility, and thus a deflection (sagging) effect of the membrane can be effectively eliminated or reduced. In addition, the proposed membrane can be formed using one or more stages of a sequential process that is compatible with the processes for forming existing semiconductor devices, and thus the yield and cost-effectiveness of manufacturing the pellicle can be enhanced.

FIG. 1 is a schematic diagram of a photolithography apparatus 100, in accordance with some embodiments of the present disclosure. The photolithography apparatus 100 is configured to perform reflective-type photolithography, such as EUV photolithography. In some embodiments, the photolithography apparatus 100 is configured to perform a photolithography operation using a reflective-type of photomask. However, in some embodiments, the photolithography apparatus 100 is adapted to perform transmission-type photolithography. Referring to FIG. 1, the photolithography apparatus 100 includes components such as a radiation source 102, an illuminator 104, a mask stage 106, a projection optics box (POB) 110, and a substrate stage 118. In some embodiments, one or more of the aforesaid components are received in a chamber 101 of the photolithography apparatus 100. In some embodiments, the aforesaid components of the photolithography apparatus 100 are arranged in different chambers.

The radiation source 102 is configured to generate a source radiation beam S0, e.g., an EUV light having a wavelength between about 1 nm and about 100 nm, such as 13.5 nm.

In some embodiments, the radiation source 102 includes a plasma generator for generating laser-produced plasma (LPP). In an LPP-based radiation source 102, droplets of a target material are generated and then travel within a vacuum chamber to an irradiation site where they are irradiated, e.g., by a focused laser beam generated by the plasma generator. The target material may include a tin-base material. A highly ionized plasma is thus generated that emits EUV radiation with a peak emission power at a desired wavelength, e.g., about 13.5 nm, to thereby generate the source radiation beam S0.

In some embodiments, the illuminator 104 includes reflective optics, such as one or more mirrors, to direct light from the radiation source 102 through one or more reflections to form illumination radiation beams S1 and S2, in which the illumination radiation beam S2 impinges on the mask stage 106. In some embodiments, the illuminator 104 is configured to shape the source radiation beam S0. In some embodiments, the illuminator 104 is configured to provide an on-axis illumination (ONI) to the mask stage 106. In some embodiments, the illuminator 104 is configured to provide an off-axis illumination (OAI) based on the source radiation beam S0. In some examples, the illuminator 104 includes a zone plate (not shown) to improve focus of the source radiation beam S0.

The mask stage 106 is configured to secure a photomask assembly 107. In some embodiments, the mask stage 106 includes an electrostatic chuck (e-chuck) to secure the photomask assembly 107. The photomask assembly 107 includes a photomask 108 and a pellicle 128, in which the pellicle 128 is arranged over the surface of the photomask 108 on which a circuit pattern is formed.

In some embodiments, not separately shown, the structure of the photomask 108 includes a substrate, a multilayer stack, a capping layer and a light-absorption layer. In some embodiments, the substrate of the photomask 108 is formed of a low thermal expansion (LTE) material, such as fused silica, fused quartz, silicon, silicon carbide, black diamond or other low thermal expansion substances.

The multilayer stack serves as a radiation-reflective layer of the photomask 108. The multilayer stack may include pairs of layers wherein each pair is formed of a molybdenum (Mo) layer and a silicon (Si) layer. The number of alternating Mo layers and Si layers (i.e., the number of Mo/Si pairs) and the thicknesses of the Mo layers and the Si layers are determined so as to facilitate constructive interference of individual reflected rays (i.e., Bragg reflection) and thus increase the EUV reflectivity of the multilayer stack.

The capping layer is disposed over the multilayer stack. In some embodiments, the capping layer is used to prevent oxidation of the multilayer stack during a mask patterning process. In some embodiments, the capping layer is made of ruthenium (Ru), ruthenium oxide ($RuO_2$), silicon dioxide ($SiO_2$), amorphous carbon or other suitable compositions.

The light-absorption layer is disposed over the capping layer. In some embodiments, the light-absorption layer is an anti-reflective layer that blocks or absorbs radiation in EUV wavelength ranges, preventing the radiation from impinging on the photomask 108. The light-absorption layer may include chromium, chromium oxide, titanium nitride, tantalum nitride, tantalum oxide, tantalum boron nitride, tantalum, titanium, aluminum-copper, combinations thereof, or the like. The light-absorption layer may be etched to expose portions of the underlying capping layer, in which the etched light-absorption layer forms the circuit pattern. Accordingly, the EUV radiation reflected off the photomask 108 forms a patterned radiation beam S3.

The configuration of the photomask 108 described above is given as an example only. Other configurations and materials of the photomask 108 are also within the contemplated scope of the present disclosure.

The pellicle 128 is configured to protect the photomask 108 from contamination of foreign particles, such that the surface of the photomask 108, e.g., the light-absorption layer or the capping layer, can be free of contaminant. In some embodiments, the pellicle 128 covers the photomask 108, in which a membrane of the pellicle 128 is attached to a frame of the pellicle 128 and forms a free-standing structure over the photomask 108. A structure of the pellicle 128 and its forming method are described in greater detail below.

The patterned radiation beam S3 is reflected from the photomask 108 and directed toward the POB 110. The POB 110 serves to transfer the image of the circuit pattern from the photomask 108 to the substrate stage 118. The POB 110 may be configured to focus the patterned radiation beam S3 to thereby form a projection radiation beam S4 onto a workpiece 116. The POB 110 may include one or more reflective optics for forming the projection radiation beam S4.

The substrate stage 118 is used for supporting and securing the workpiece 116, which is to be patterned using EUV photolithography. The substrate stage 118 may include one or more positioning devices, such as motors and roller guides, to move the workpiece in various directions for accurate alignment and better performance in focusing, leveling, and exposure.

The workpiece 116 is provided with a substrate having one or more material layers formed thereon. The substrate may be a wafer substrate. In various embodiments, the wafer substrate includes a semiconductor wafer, such as a silicon wafer, germanium wafer, silicon-germanium wafer, III-V semiconductor wafer, or other type of wafer as known in the art. The material layer may be a photosensitive material, e.g., a photoresist sensitive to EUV radiation.

FIGS. 2A to 2L are cross-sectional views of intermediate stages of a method of manufacturing a pellicle 200, in accordance with some embodiments of the present disclosure. The pellicle 200 can be used as the pellicle 128 of the photolithography apparatus 100.

Figure 2A:
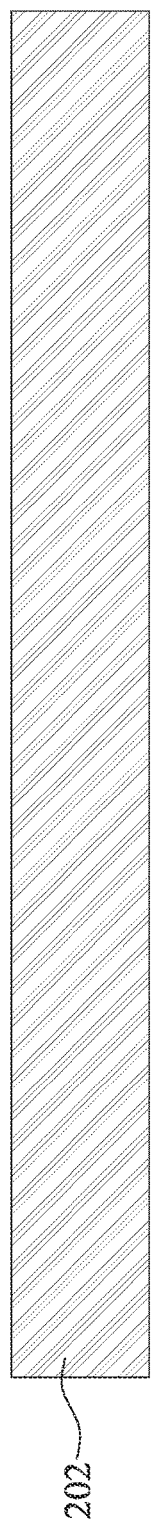
FIGS. 2A to 2L are cross-sectional views of intermediate stages of a method of manufacturing a photomask pellicle, in accordance with some embodiments of the present disclosure.

Referring to FIG. 2A, a substrate 202 is provided or formed. The substrate 202 includes a semiconductor material such as bulk silicon. In some embodiments, the substrate 202 includes other semiconductor materials, such as silicon germanium, silicon carbide, gallium arsenide, or the like. In some embodiments, the substrate 202 is a doped semiconductive substrate, such as a p-type or an n-type substrate. Alternatively, the substrate 202 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In another alternative, the substrate 202 is a semiconductor-on-insulator (SOI) substrate. In some other alternatives, the substrate 202 includes a doped epitaxial layer, a gradient semiconductor layer, and/or a semiconductor layer overlaying another semiconductor layer of a different type, such as a silicon layer on a silicon germanium layer.

Figure 2B:
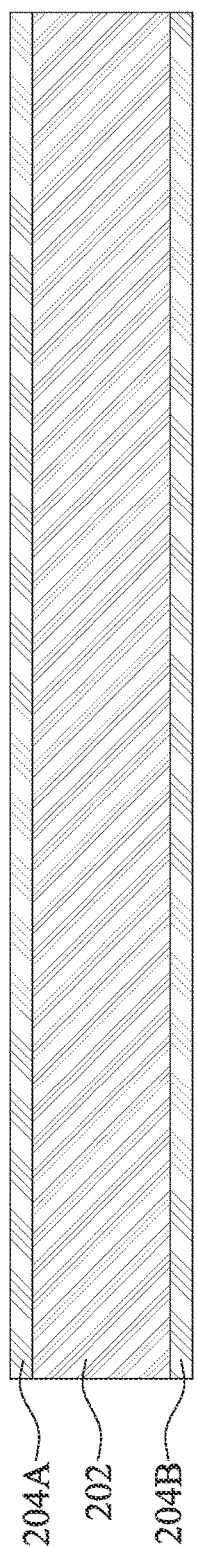

Referring to FIG. 2B, one or more buffer layers 204 are formed on the substrate 202. In some embodiments, two buffer layers, e.g., an upper buffer layer 204A and a lower buffer layer 204B, are formed on two sides of the substrate 202. In some embodiments, the buffer layer 204 serves as a sacrificial layer and may be at least partially removed from the substrate 202 in a subsequent operation. In some embodiments, the buffer layer 204 is configured to release or buffer stress generated by materials or layers that may be otherwise directly formed on the substrate 202. The buffer layer 204 may include a dielectric material, such as silicon oxide, silicon nitride, silicon oxynitride or the like. In some embodiments, the buffer layer 204 has a thickness between about 5 nm (nanometer) and about 100 nm on each side of the substrate 202.

The buffer layer 204 may be formed using an oxidation and/or nitridation operation. In some embodiments, the buffer layer 204 may be formed using furnace anneal, spin-on coating, chemical vapor deposition (CVD), physical vapor deposition (PVD), atomic layer deposition (ALD), or other suitable operations.

Figure 2C:
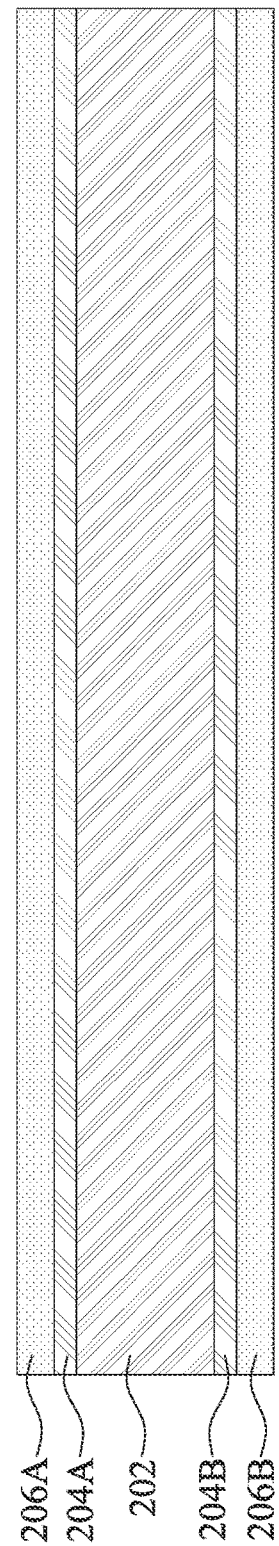

Referring to FIG. 2C, one or more capping layers 206 are formed on the buffer layer 204. In some embodiments, two capping layers, e.g., an upper capping layer 206A and a lower capping layer 206B, are formed on outer sides of the buffer layers 204A and 204B, such that the buffer layer 204A or 204B is arranged between the substrate 202 and the corresponding capping layer 206A or 206B. In some embodiments, the capping layers 206 serve as stress-inducing layers to provide tensile stress on a membrane (e.g., a nanowire 208 shown in FIG. 2D) attached thereto. In such situation, the buffer layer 204 is formed to buffer or release the tensile stress generated by the capping layers 206.

The capping layer 206 may include a dielectric layer, such as silicon oxide, silicon nitride, silicon oxynitride and silicon carbide or the like. In some other embodiments, the capping layer 206 is formed of zirconium nitride or zirconium oxide. In some embodiments, the capping layer 206 and the buffer layer 204 are formed of different materials for generating stresses of different types or different directions. In the depicted example, the buffer layer 204 and the capping layer 206 are formed of silicon oxide and silicon nitride, respectively. In some embodiments, the capping layer 206 has a thickness between about 2 nm and about 30 nm on each side of the substrate 202. The capping layer 206 may be formed by CVD, PVD, ALD, or other suitable operations.

Referring to FIG. 2D and FIGS. 3A to 3C, a nanowire layer 208 is formed on one side of the substrate 202. In some embodiments, the nanowire layer 208 is formed on the upper capping layer 206A. The nanowire layer 208 is also referred to as a membrane of the pellicle 200. The nanowire layer 208 is formed of a plurality of nanowires 302 arranged in a network, in which the nanowires 302 cross one another to form a network or mesh.

Figure 3A:
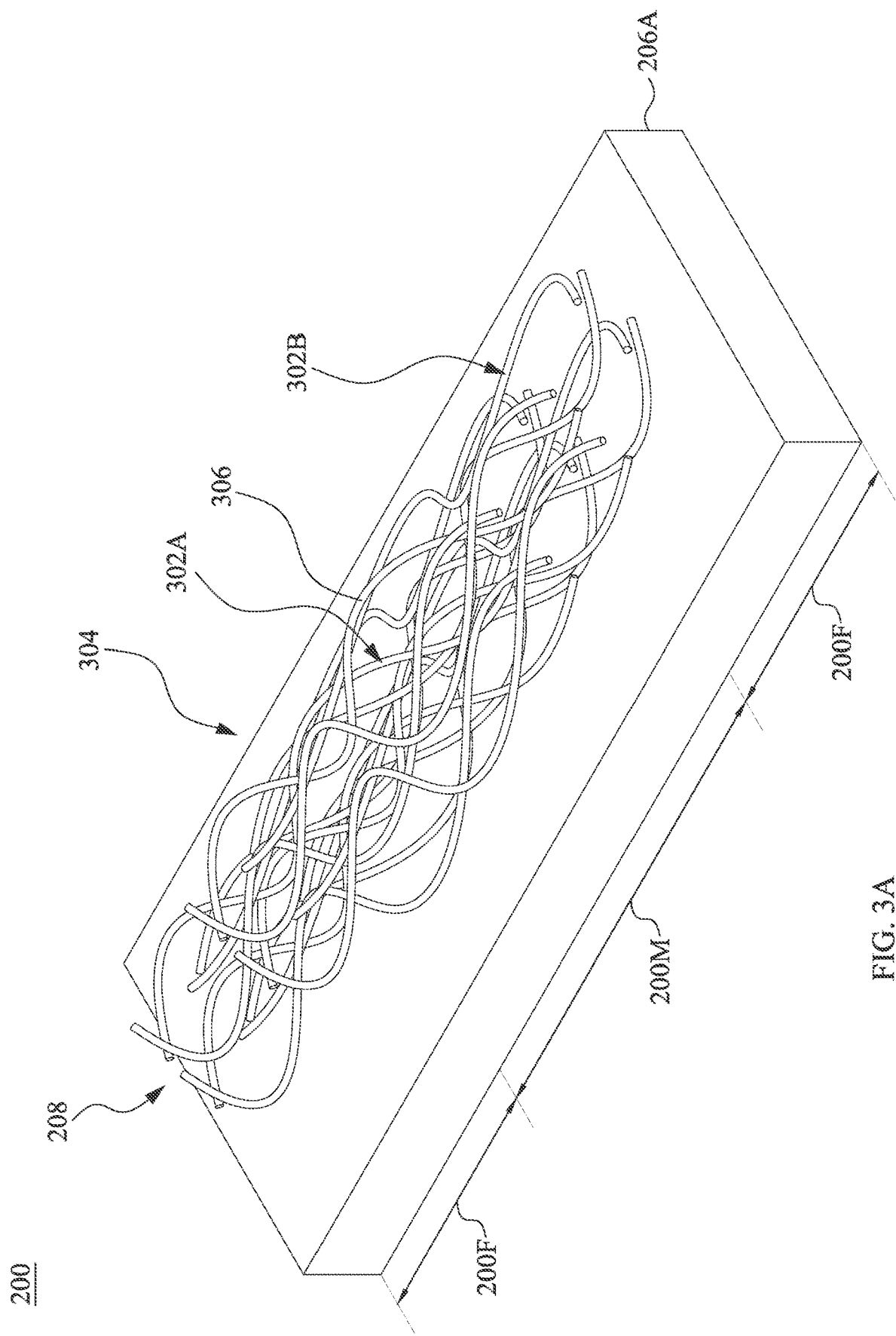
Figure 3C:
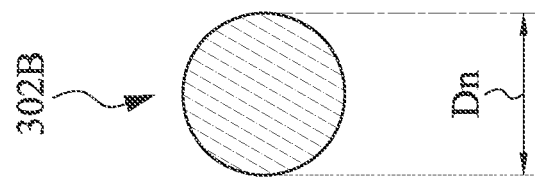
Figure 3B:
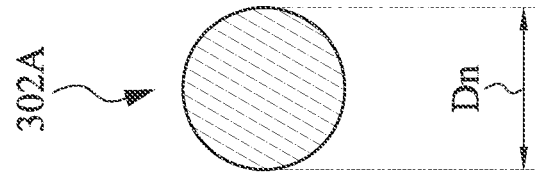

Referring to FIG. 3A, each of the nanowires 302, e.g., nanowires 302A and 302B, bends or meanders gently on the upper capping layer 206A. In some embodiments, the bending and crossing nanowires 302 cause the nanowire layer 208 to be a porous film including irregular pores or gaps 304 between the crossing nanowires 302. Referring to FIG. 3A, the nanowire 302A is referred to as a portion of the nanowire layer 208 arranged in the main region of the pellicle 200, and the nanowire 302B is referred to as a portion of the nanowire layer 208 arranged in the frame region of the pellicle. Referring to FIGS. 3B and 3C, the nanowires 302A and 302B may have a width or diameter Dn in a range between about 5 nm and about 50 nm, or between about 2 nm and about 20 nm, such as 10 nm. In some embodiments, the gaps 304 of the nanowire layer 208 have a size less than a width of the foreign particles such that foreign particles can be blocked by the nanowire layer 208 while the EUV transmittance can be enhanced due to the presence of these gaps 304. In some embodiments, the width of the gap 304 of the nanowire 208 is on the order of nanometers or tens of nanometers.

In some embodiments, the nanowire 302 is formed of carbon, such as carbon nanotube. In some other embodiments, the nanowire 302 is formed of molybdenum silicide, molybdenum silicon nitride, boron carbide, boron nitride, or carbon nanotube covered with metal silicide such as MoSiN, MoSi, ZrSi, ZrSIN or the like. In some embodiments, the nanowire 302 is a metallic compound, such as molybdenum silicon nitride or boron silicon nitride. In some embodiments, the nanowire 302 includes a carbon nanotube with a single-wall or multi-wall structure. In the depicted embodiment, a cross section of the nanowire 302A or 302B is in a circular shape. However, other shapes of the cross section for the nanowires 302 are also possible, such as an oval shape or a polygonal shape, e.g., a quadrilateral shape, hexagonal shape, or the like.

In some embodiments, the nanowire 302 is grown using a thermal decomposition synthesis method through plasma-enhanced CVD. For example, in an embodiment where the nanowire 302 is formed of carbon nanotubes, the substrate 202 with the as-formed buffer layer 204 and the capping layer 206 are arranged in a furnace. A metal-containing catalyst vapor, e.g., ferrocene powders, is introduced into a process tube of the furnace from an upstream pipe in an ambient of carbon monoxide or carbon dioxide. In some embodiments, iron in the ferrocene powders may aid in facilitating synthesis of carbon nanotubes along the process tube. In some embodiments, the carbon nanotube is grown at a process temperature between about 800° C. and about 1200° C., and a flow rate of the carbon monoxide or carbon dioxide is between 0.1 L/min and about 5 L/min. The carbon nanotubes are grown along the process tube of the furnace and formed on the capping layer 206 downstream of the process tube. The diameters Dn and/or lengths of the grown nanowire 302 can be determined according to the parameters of various process recipes.

Figure 2D:
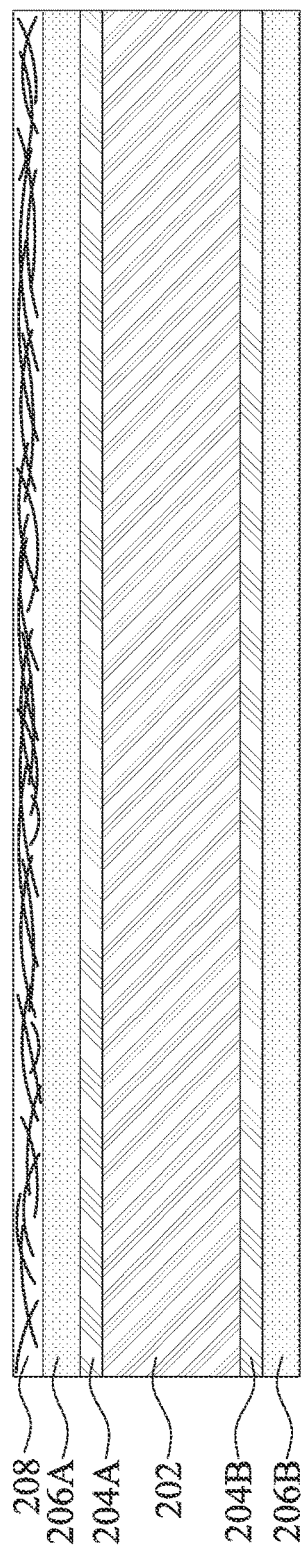
Figure 2E:
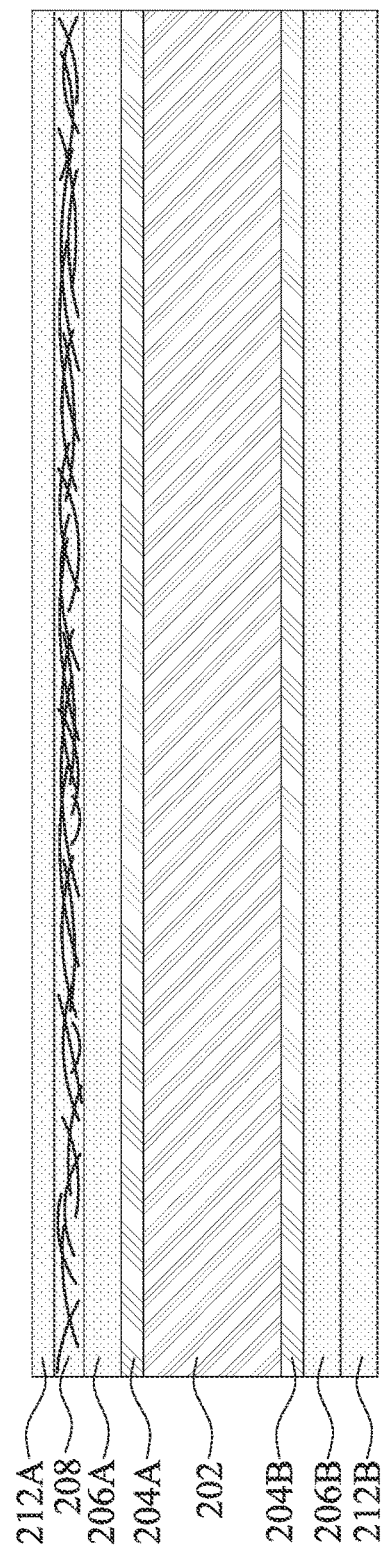
Figure 3D:
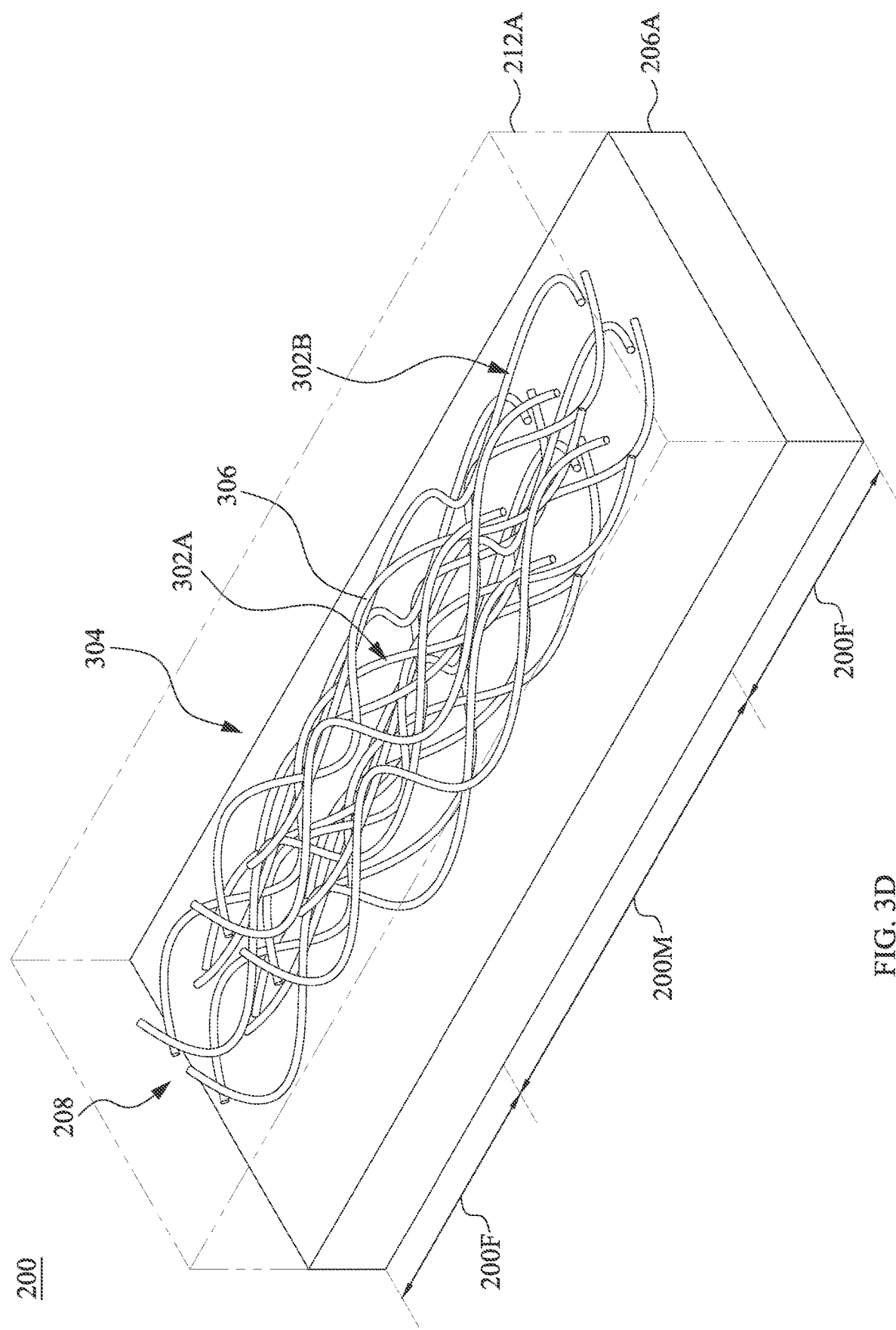
Figure 3F:
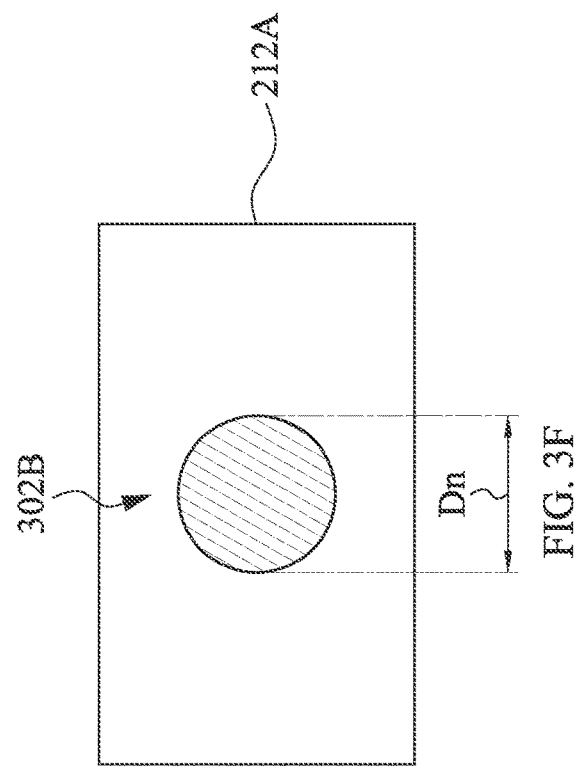
Figure 3E:
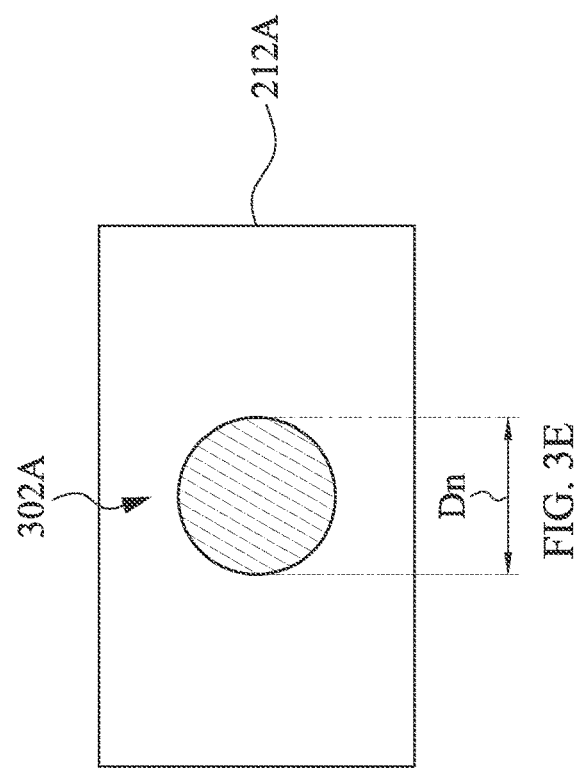

Referring to FIGS. 2E and 3D, one or more capping layers 212 are formed around the substrate 202. In some embodiments, an upper capping layer 212A is formed over the nanowire layer 208, while a lower capping layer 212B is formed on a lower side of the lower capping layer 206 on a side of the substrate 202 opposite to the nanowire layer 208. In some embodiments, the upper capping layer 212 serves as another stress-inducing layer to provide tensile stress on the underlying nanowire 208. Referring to FIG. 3B, the upper capping layer 212 covers and encapsulates the nanowires 302 of the nanowire layer 208 and fills the gaps 304 between the nanowires 302. Referring to FIGS. 3E and 3F, the exemplary nanowires 302A and 302B are encapsulated by the material of the upper capping layer 212A.

The capping layer 212 may include a dielectric layer, such as silicon oxide, silicon nitride, silicon carbide or the like. In some other embodiments, the capping layer 212 is formed of zirconium nitride or zirconium oxide. In some embodiments, the capping layer 212 and the buffer layer 204 are formed of different materials for generating stresses of different types or stresses with different directions on the nanowire 208. In some embodiments, the capping layer 212 and the capping layer 206 include the same material. In the depicted example, the buffer layer 204 is formed of silicon oxide, and the capping layers 206, 212 are formed of silicon nitride. In some other embodiments, the capping layer 212 and the capping layer 206 are formed of different materials while generating the same type of stress, such as tensile stress. In some embodiments, the capping layer 212 has a thickness between about 2 nm and about 30 nm on each side of the substrate 202. The capping layer 212 may be formed by CVD, PVD, ALD, or other suitable operations.

Figure 2F:
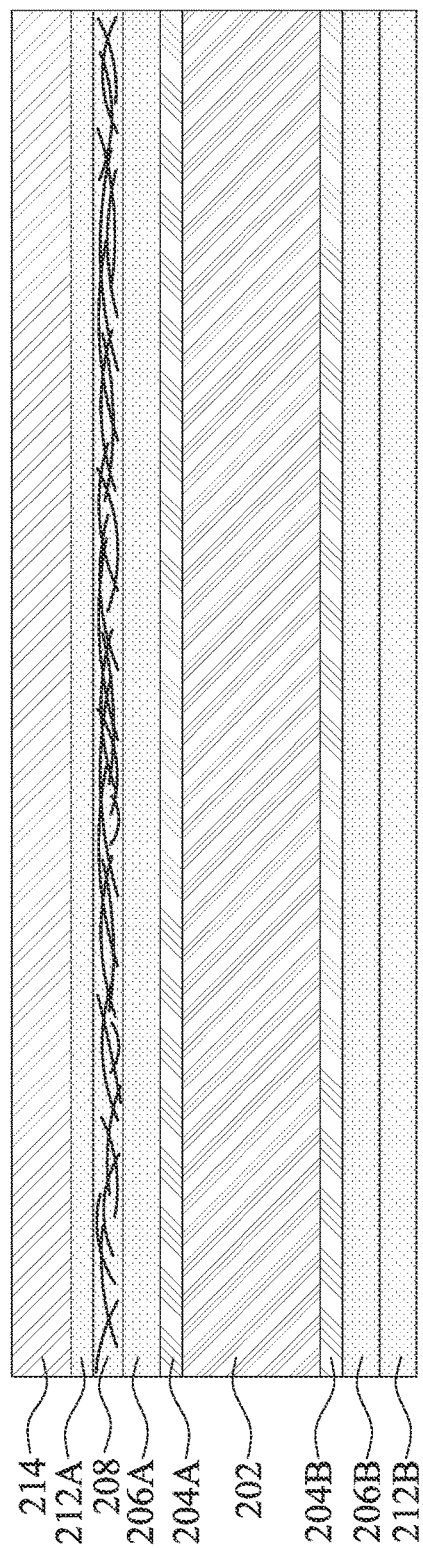

FIG. 2F illustrates the formation of a protection layer 214 over the upper capping layer 212A. In some embodiments, the protection layer 214 includes chromium nitride (CrN), chromium oxynitride (CrON), or another suitable conductive material. In some other embodiments, the protection layer 214 is formed of silicon-based materials, such as silicon nitride, silicon oxide, silicon carbide or silicon carbon nitride. In some embodiments, the protection layer 214 includes polymer-based materials. In some embodiments, the protection layer 214 includes a thickness in a range from about 50 nm to about 400 nm. The protection layer 214 may have a surface area less than the surface area of the substrate 202. The protection layer 214 may be formed by CVD, ALD, molecular beam epitaxy (MBE), PVD, pulsed laser deposition, electron-beam evaporation, ion beam assisted evaporation, or any other suitable film-forming method.

Figure 2G:
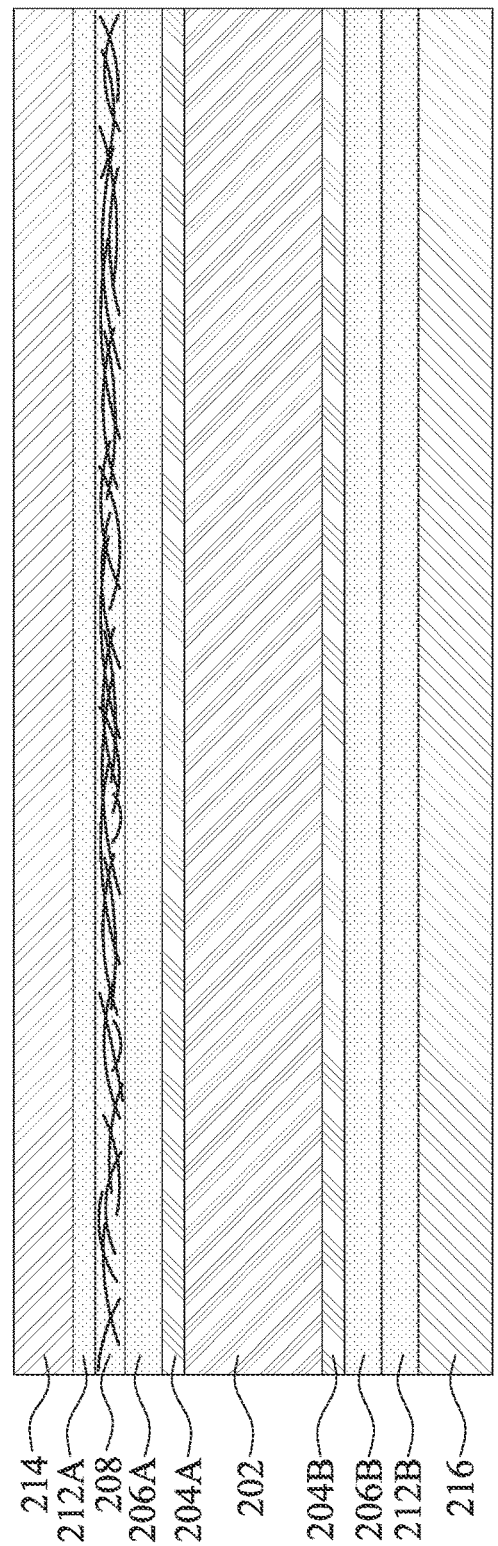

Referring to FIG. 2G, a mask layer 216 is formed on the lower capping layer 212B on a side of the substrate 202 opposite to the protection layer 214. The mask layer 216 may be formed of a dielectric layer, such as nitride, oxide, oxynitride, or the like. The mask layer 216 may be formed using CVD, PVD, ALD, or other suitable deposition methods.

Figure 2H:
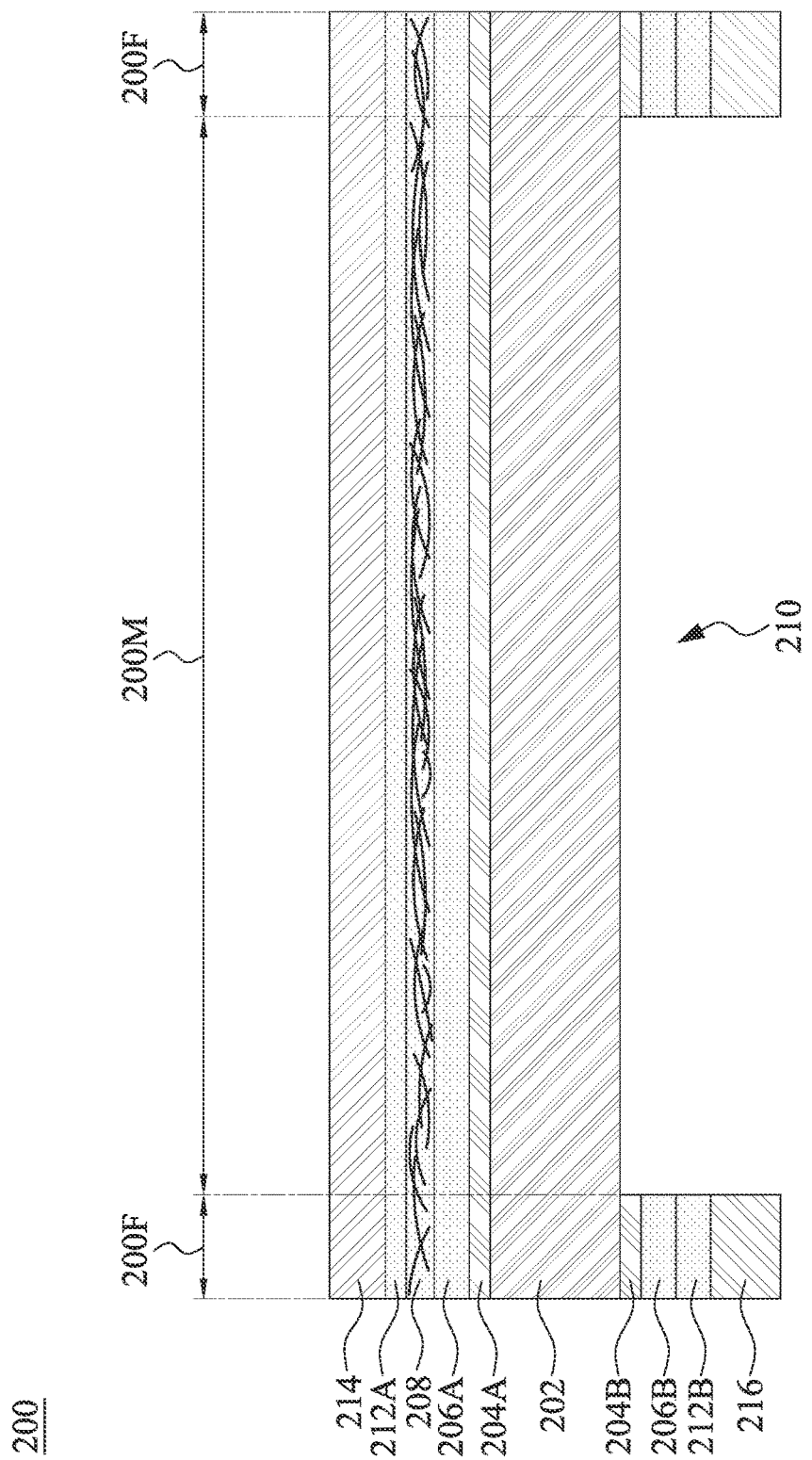

Referring to FIG. 2H, a patterning operation is performed on the mask layer 216. In some embodiments, the substrate 202 is flipped before the patterning operation is performed. The patterning operation may be performed using photolithography and etching operations. The etching operation may include a dry etch, a wet etch, or a combination thereof, e.g., reactive ion etch (RIE). Through the patterning operation, portions of the mask layer 216 around the central part of the substrate 202 are etched, leaving a periphery of the mask layer 216 on the lower capping layer 212B. In some embodiments, the patterned mask layer 216 has a ring shape from a top-view perspective. The patterned mask layer 216 may define a frame region 200F of a frame of the pellicle 200. The frame region 200F laterally surrounds a main region 200M as an interior space of the pellicle 200, in which the main region 200M is configured to allow EUV light to pass through while preventing the particles from adhering to the surface of the photomask covered by the main region 200M.

Subsequently, the lower buffer layer 204B, the lower capping layer 206B and the lower capping layer 212B are patterned. The pattering operation may be performed using an etching operation. In some embodiments, the etching operation is performed using the patterned mask layer 216 as an etching mask, in which the etch stops at the substrate 202. In some embodiments, the etching of the lower buffer layer 204B, the lower capping layer 206B and the lower capping layer 212B includes a dry etch, a wet etch, an RIE, or the like. In some embodiments, the lower buffer layer 204B, the lower capping layer 206B and the lower capping layer 212B are etched using a single etching operation or separate etching operations. Accordingly, a cavity 210 defined by the lower buffer layer 204B, the lower capping layer 206B and the lower capping layer 212B is formed through the etching operation.

Figure 2I:
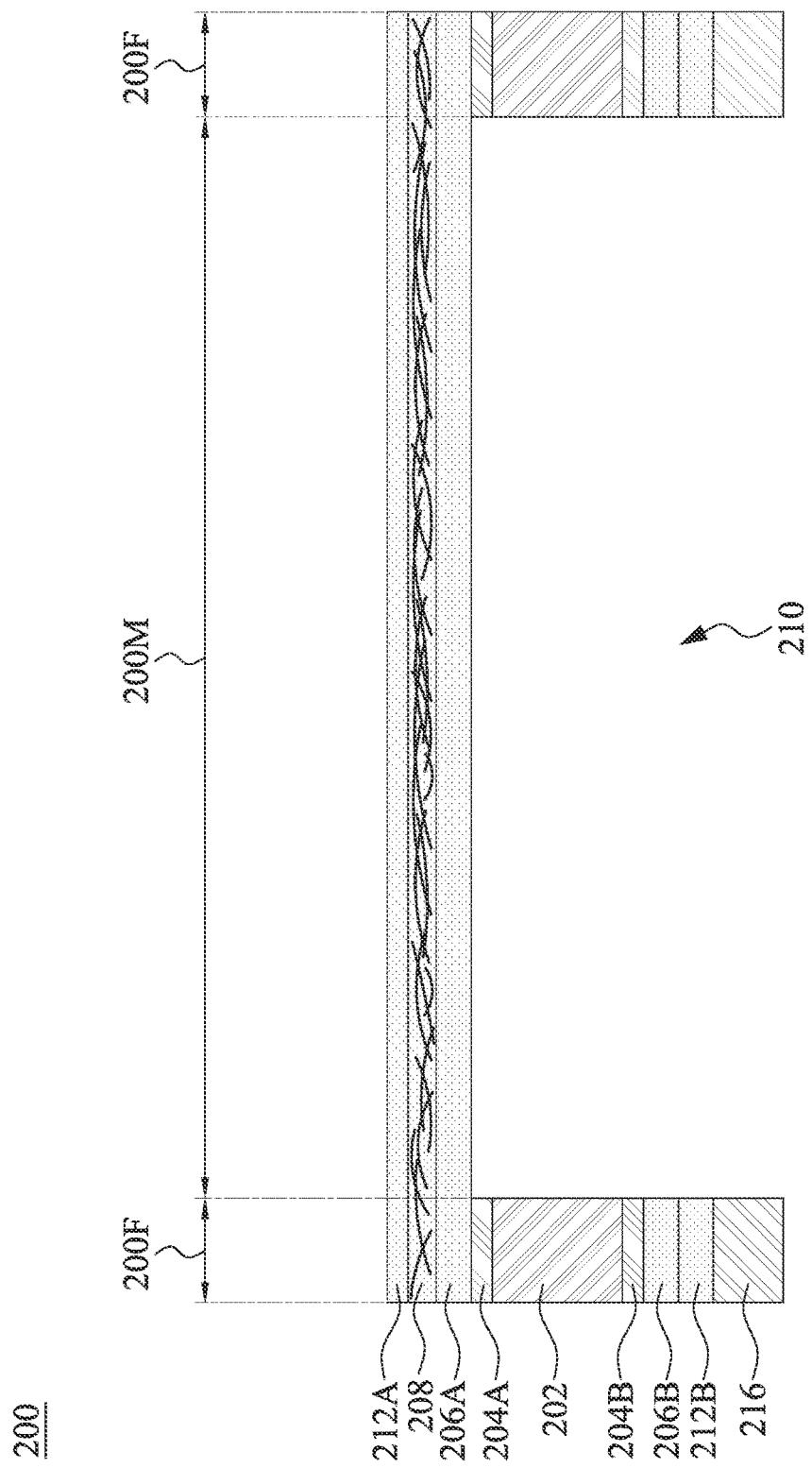

Referring to FIG. 2I, the substrate 202 and the upper buffer layer 204A are patterned. The pattering operation may be performed using an etching operation. In some embodiments, the etching operation is performed using the patterned mask layer 216 as an etching mask, in which the etch stops at the upper capping layer 206. In some embodiments, the etching of the substrate 202 and the upper buffer layer 204A includes a dry etch, a wet etch, an RIE, or the like. In some embodiments, the substrate 202 and the upper buffer layer 204A are etched using a single etching operation or separate etching operations. Accordingly, the cavity 210 is extended through the substrate 202 and the upper buffer layer 204A by the etching operation.

In some embodiments, the protection layer 214 is removed from the pellicle 200. In some embodiments, the removal of the protection layer 214 is performed by an etching or stripping operation. The etching operation may include a dry etch, a wet etch, an RIE or the like. In some embodiments, the protection layer 214 is removed prior to, subsequent to, or at the same time of the etching of the upper buffer layer 204A.

Figure 2J:
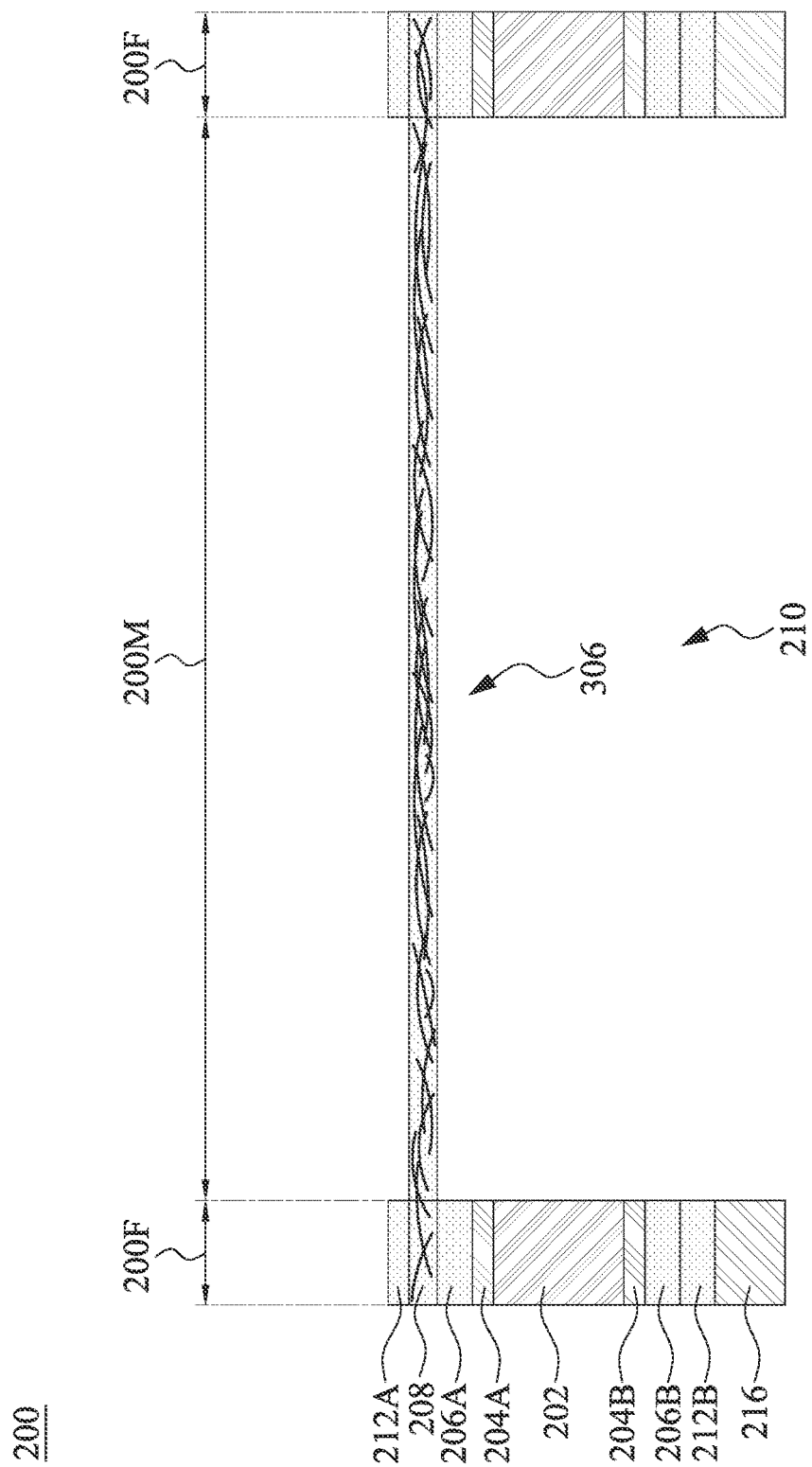
Figure 3G:
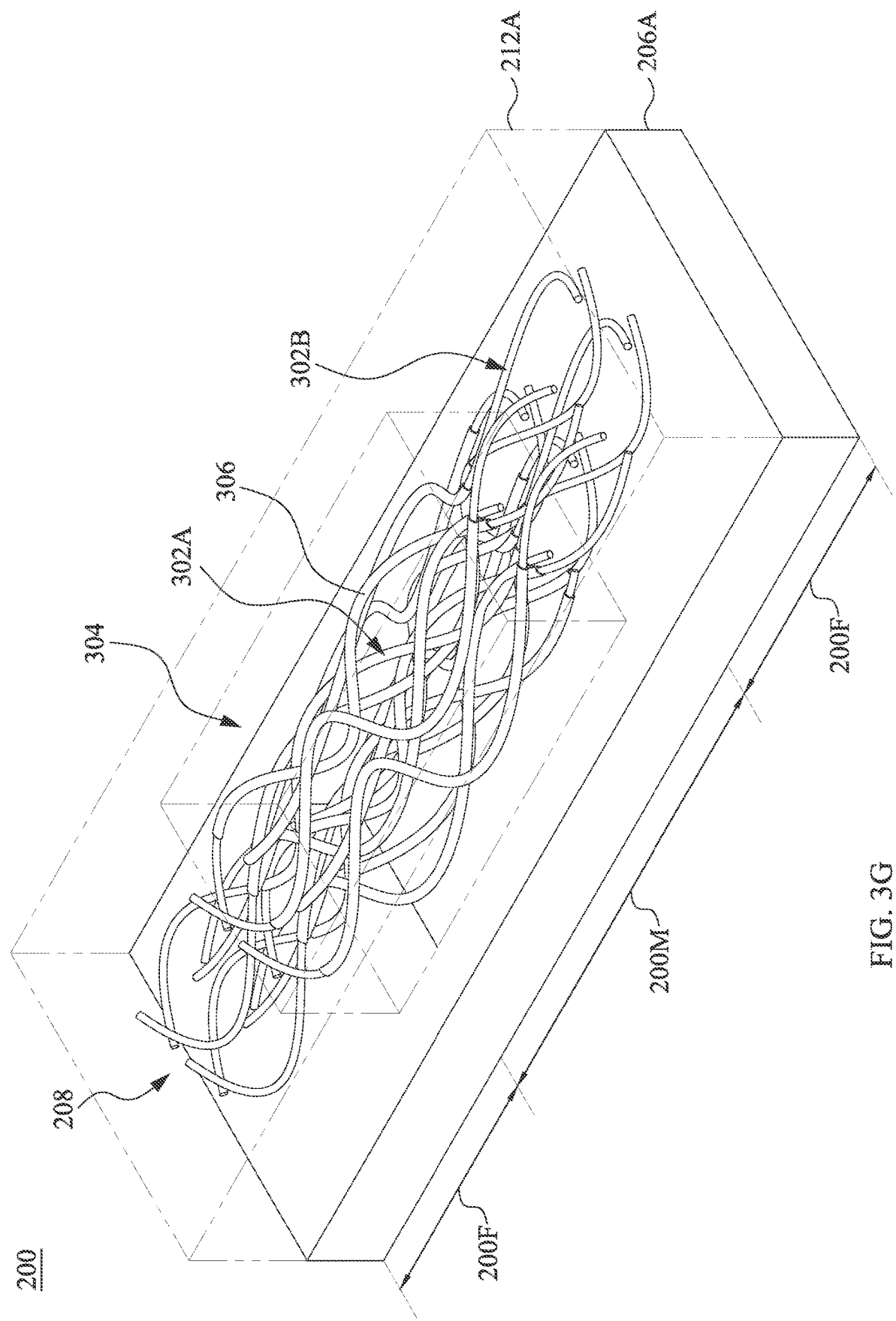

Referring to FIGS. 2J and 3G, the upper capping layer 206A and the upper capping layer 212A are patterned according to the mask layer 216. The patterning operation may be performed using an etching operation using the mask layer 216 as the etching mask. In some embodiments, the etching of the upper capping layers 206A and 212A includes a wet etch, an RIE, or the like. In some embodiments, the upper capping layers 206A and 212A are etched using a single etching operation or separate etching operations. Accordingly, the cavity 210 is extended through the nanowire layer 208 by the etching operation while the nanowires 302 are kept intact during the etching operation. As a result, the main region 200M of the pellicle 200 is formed to expose the nanowires 302, while the portions of the nanowires 302, e.g., a periphery of the upper capping layer 206A and the upper capping layer 212A, within the frame region 200F are kept un-etched and covered by the upper capping layers 212A and encapsulated by the upper capping layers 212A and 206A.

During the etching of the upper capping layers 206A and 212A, portions of the upper capping layer 212A in the nanowire layer 208 between the adjacent nanowires 302 are also etched. Accordingly, the gaps 304 of the nanowires 302 within the main region 200M appear again through the etching, as shown in FIG. 2J and FIG. 3C. As a result, the nanowire layer 208 is used as the membrane of the pellicle 200, in which the nanowire layer 208 is anchored at the frame and functions as a free-standing structure over the cavity 210.

In some embodiments, through the etching shown in FIG. 2J, portions of the upper capping layer 212A in the main region 200M are left on the surfaces of the nanowires 302, e.g., nanowire 302A. Referring to FIG. 3H, the un-etched portions of the upper capping layer 212A form a coating or a shell layer 306 on the nanowire 302A for protecting the nanowires 302A from exposure to radicals or atoms of contaminant-preventing gas, such as hydrogen, that is generally present within an EUV photolithography apparatus during an EUV lithography operation, and for preventing accumulation of contaminants on the mirrors of the EUV photolithography apparatus. Through the etching operation shown in FIG. 2J and FIG. 3C, the exposed nanowire 302A within the main region 200M of the nanowire layer 208 can be effectively protected by the coating 306 from being damaged by the contaminant-preventing gas. In some embodiments, the coating of the nanowires 302A has a thickness De between about 0.5 nm and about 4 nm, or between about 1 nm and about 3 nm, such as 2 nm. In some embodiments, a ratio of the diameter Dn to the thickness De is between about 1 and about 10, or between about 4 and about 8, such as about 5. In some embodiments, the etching operation of the upper capping layers 206A and 212A cause a substantially uniform thickness Dc of the coating 306 on the nanowires 302A. In some embodiments, during the formation of the frame of the pellicle 200 as illustrated in FIG. 2I, the remaining portions of the lower capping layer 206B and the lower capping layer 212B on the frame of the pellicle 200 can also serve the function of preventing the adverse effect of the contaminant-preventing gas, just like the functions of the upper capping layers 206A and 212A. In some embodiments, the coating 306 has a uniform distribution of the thickness Dc across the main region 200M but still covers the entirety of the nanowires 302A. Accordingly, the nanowires 302A coated with the coating 306 and the nanowires 302B encapsulated by the upper capping layers 212A and 206A form the membrane of the pellicle 200.

The proposed membrane structure and its forming method provide advantages. Since the upper capping layers 212A and 206A provide tensile stress on the nanowires 302, the remaining portions of the upper capping layers 212A and 206A in the frame region 200F continue to exert tensile stress on the nanowires 302A in the main region 200M. This tensile stress may help pull the thin-film membrane of the nanowire layer 208 to stretch outwardly without external force, such that the membrane of the pellicle 200 can have a substantially flat surface. As a result, the nanowire layer 208 can be formed with a relatively low thickness, e.g., less than about 50 nm, while maintaining a substantially flat surface with enhanced material durability and ductility. Therefore, the service lifetime of the pellicle 200 can be extended and the cost of maintaining the pellicle 200 can be reduced.

Figure 2K:
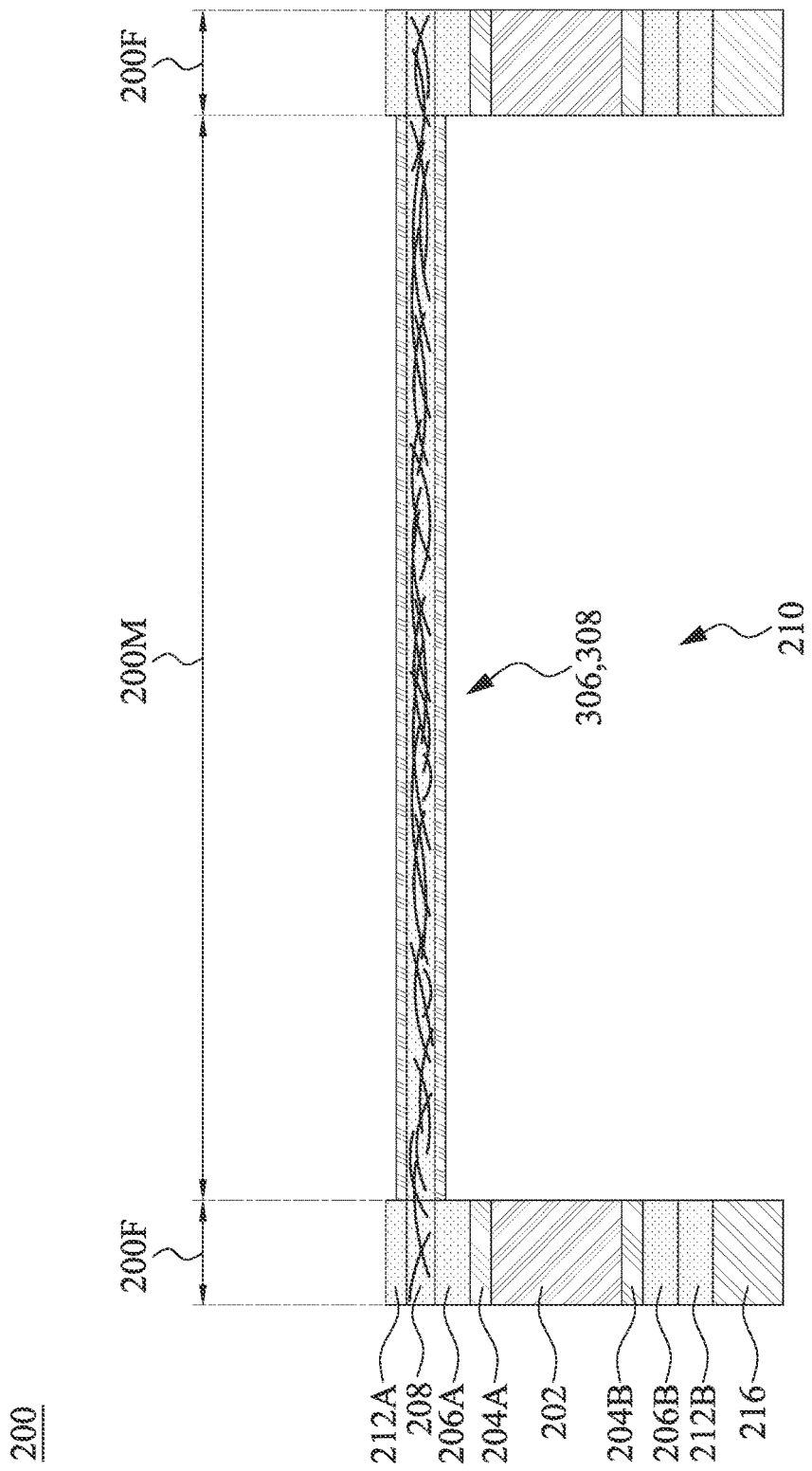
Figure 3J:
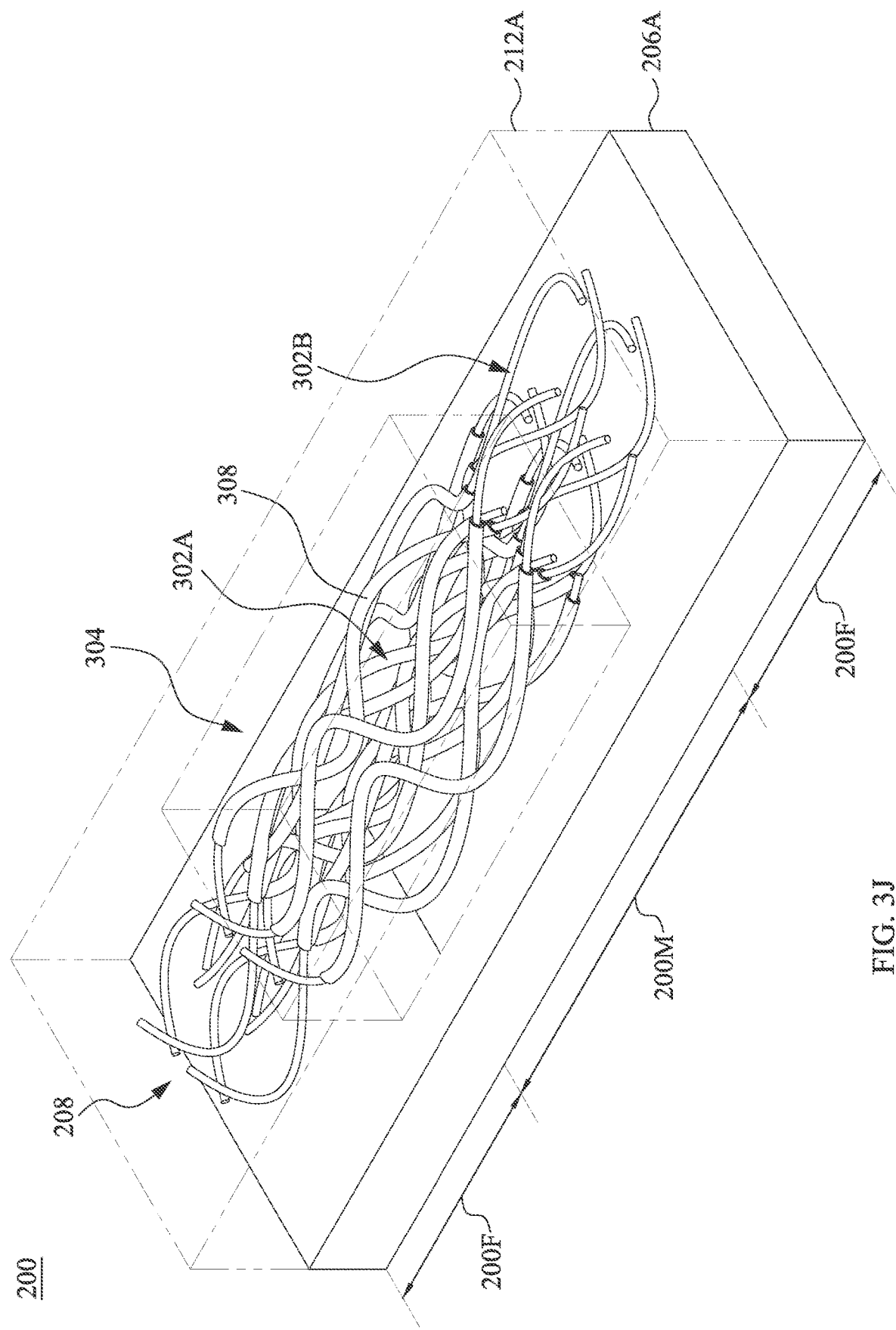
Figure 3L:
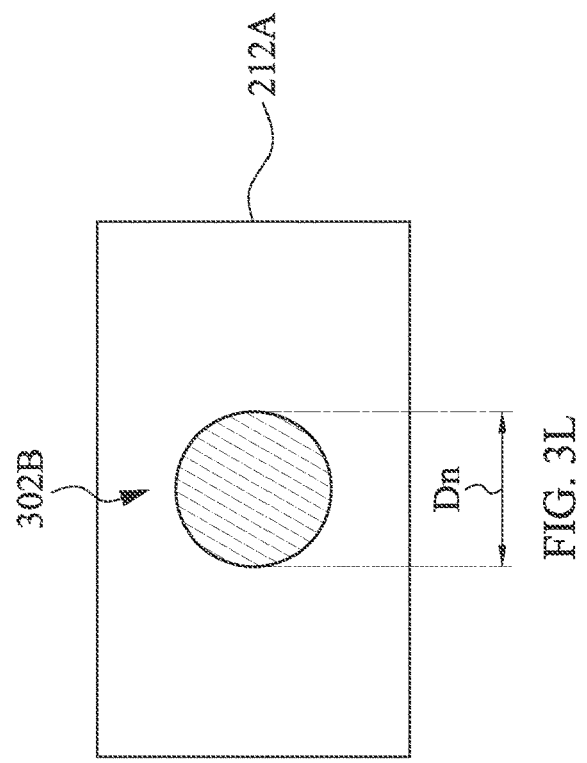
Figure 3K:
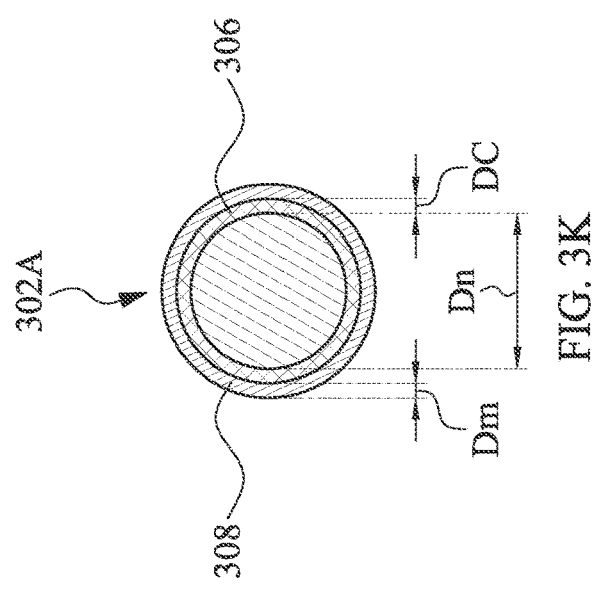

Referring to FIG. 2K and FIG. 3D, a thermal conductive layer 308 is deposited over the nanowires 302, e.g., the nanowire 302A, within the main region 200M of the nanowire layer 208. The thermal conductive layer 308 is configured to conduct heat, which is generated during the EUV photolithography operation, away from the nanowires 302. Referring to FIG. 3J, the thermal conductive layer 308 is deposited on the nanowires 302A within the main region 200M. Referring to FIG. 3K, the thermal conductive layer 308 is formed on surfaces of the coating 306. The thermal conductive layer 308 may have a thickness Dm between about 0.5 nm and about 4 nm, or between about 1 nm and about 3 nm, such as 2 nm. In addition, referring to FIG. 3L, the nanowires, e.g., the nanowire 302B, arranged within the frame region 200F remain encapsulated by the upper capping layers 206A and 212A only. Accordingly, the nanowires 302A coated with the thermal conductive layer 308 and the nanowires 302B encapsulated by the upper capping layers 206A and 212A form the membrane of the pellicle 200.

The thermal conductive layer 308 may include a metallic-containing material, such as molybdenum silicon nitride, zirconium silicon nitride or boron silicon nitride, boron carbide. The thermal conductive layer 308 may be formed using CVD, PVD, ALD, or other suitable deposition methods. In some embodiments, the thermal conductive layer 308 may extend to an upper surface of the upper capping layer 212A. In some embodiments, an etching operation may be performed to reduce the thermal conductive layer 308 to a desired thickness, or to remove excess portions of the thermal conductive layer 308 from the upper capping layer 212A.

The performance of thermal conduction of the thermal conductive layer 308 may be achieved by various configurations of the distribution of the thermal conductive layer 308. Referring to FIG. 3J, in some embodiments, the thermal conductive layer 308 covers an entirety of the nanowires 302A within the main region 200M. In some embodiments, the thermal conductive layer 308 covers only portions of the nanowires 302A within the main region 200M such that portions of the coating 306 are exposed through the thermal conductive layer 308.

In some embodiments, the thermal conductive layer 308 is formed on the nanowires 302 after the formation of the nanowire layer 208 prior to the deposition of the capping layer 212. In such scenarios, after the etching of the upper capping layers 206A and 212A to form the coating 306, the thermal conductive layer 308 is still included between the coating layer and the nanowires 302A. Referring to FIG. 3K, in the embodiments where the thermal conductive layer 308 is formed on the nanowires 302 after the formation of the nanowire layer 208 prior to the deposition of the capping layer 212, the cross-sectional view of the nanowire structure 302A will show that the coating 306 wrap the thermal conductive layer 308 and the nanowire 302A. In some embodiments where the thermal conductive layer 308 includes nitrogen, such nitrogen may provide protection of the nanowire 302A from the damage by the contaminant-cleaning gas. In some embodiments, the coating 306 may include openings exposing the underlying nitrogen-containing thermal conductive layer 308 while the nanowire 302A can be protected from the contaminant-cleaning gas.

Figure 2L:
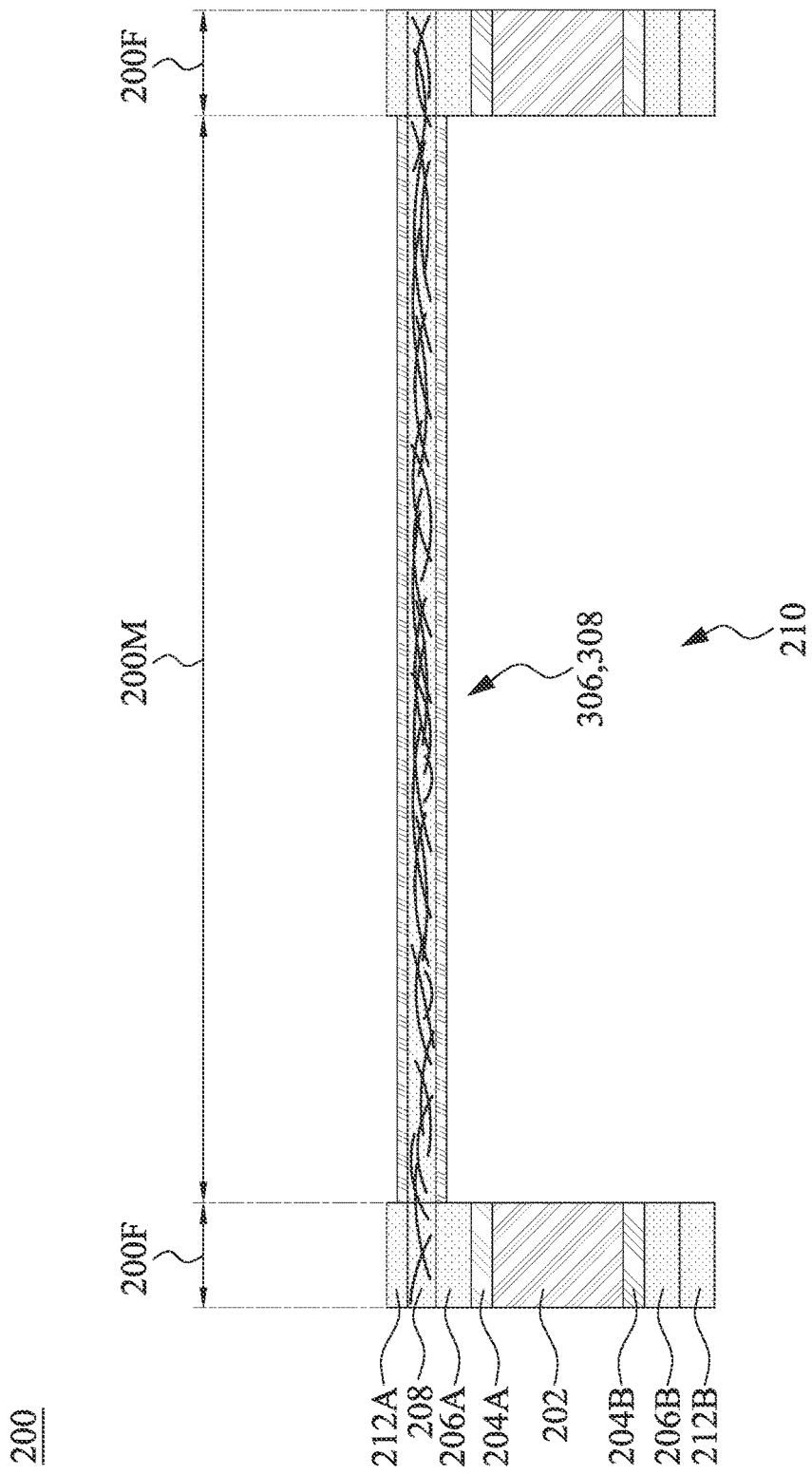

Referring to FIG. 2L, the mask layer 216 is removed or stripped from the pellicle 200. The removal of the mask layer 216 may be performed using an etching operation, which includes a dry etch, a wet etch, an RIE or the like. Referring to FIG. 2L and FIG. 3D, the patterned upper capping layers 212A and 206A, the upper buffer layer 204A, the patterned substrate 202, the patterned lower buffer layer 204B, and the patterned lower capping layers 206B and 212B form the frame of the pellicle 200. In some embodiments, the mask layer 216 is kept and the frame of the pellicle 200 includes the mask layer 216.

Figure 4A:
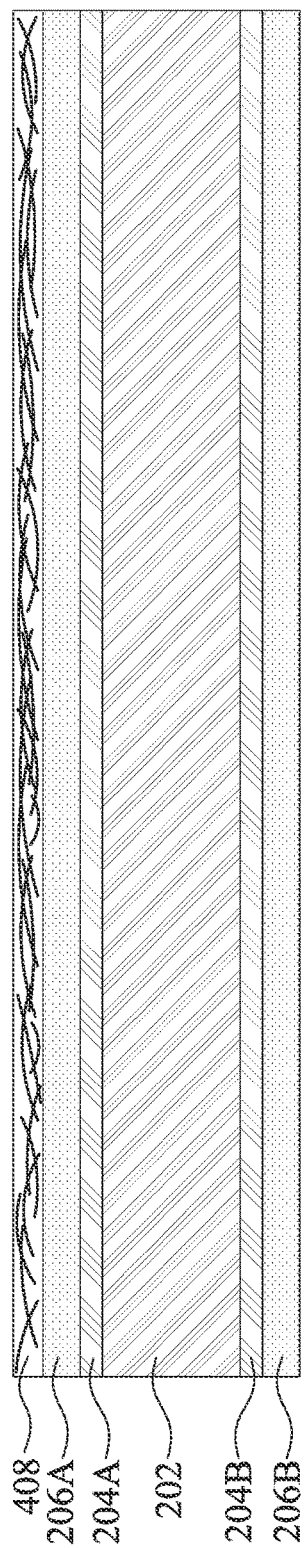
Figure 4B:
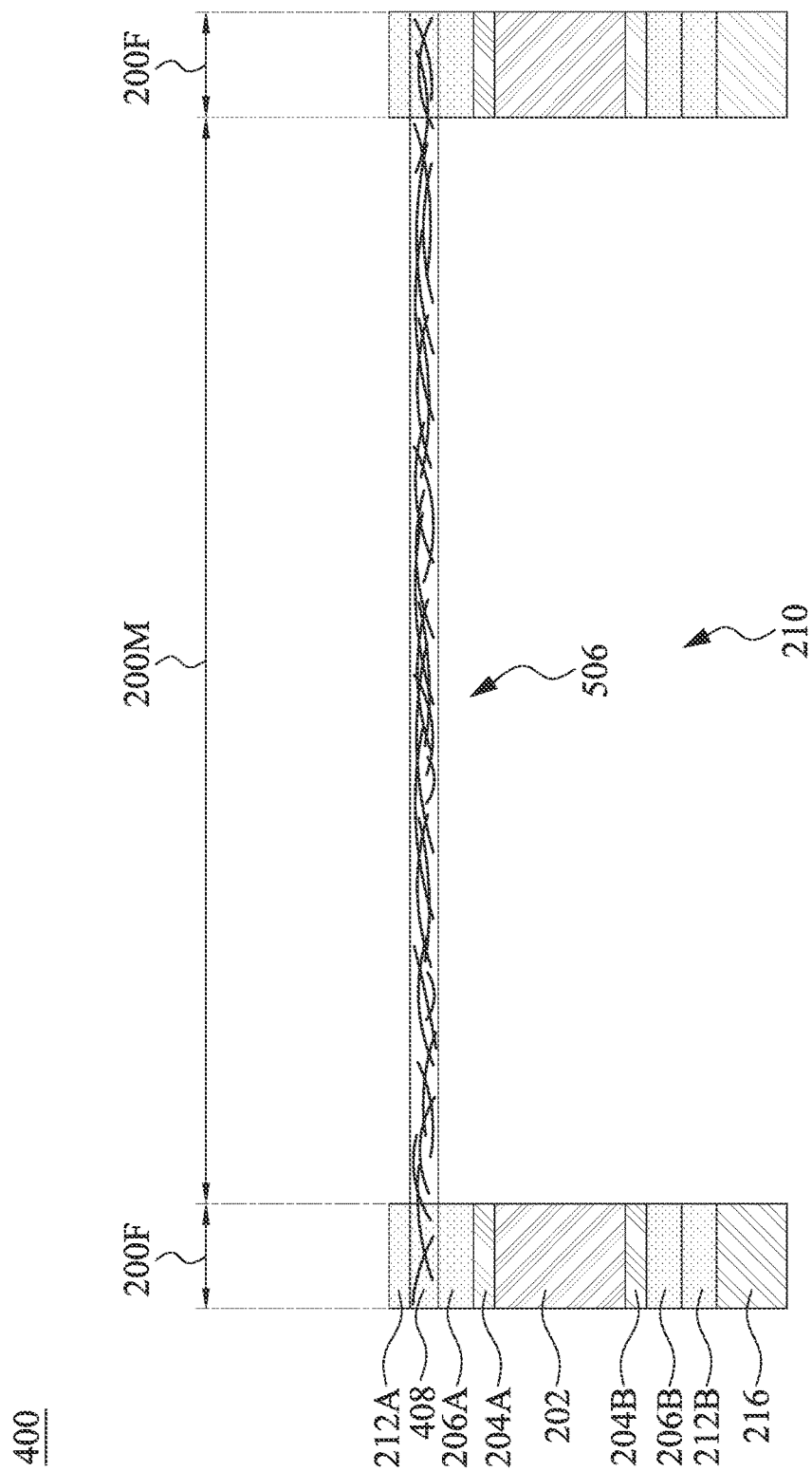

FIGS. 4A to 4C are cross-sectional views of intermediate stages of a method of manufacturing a pellicle 400, in accordance with some embodiments of the present disclosure. The pellicle 400 can be used as the pellicle 128 of the photolithography apparatus 100. The method of forming the pellicle 400 is similar to that of forming the pellicle 200, and detailed descriptions of similar intermediate stages of the method for forming the pellicle 400 are omitted for brevity.

Figure 5A:
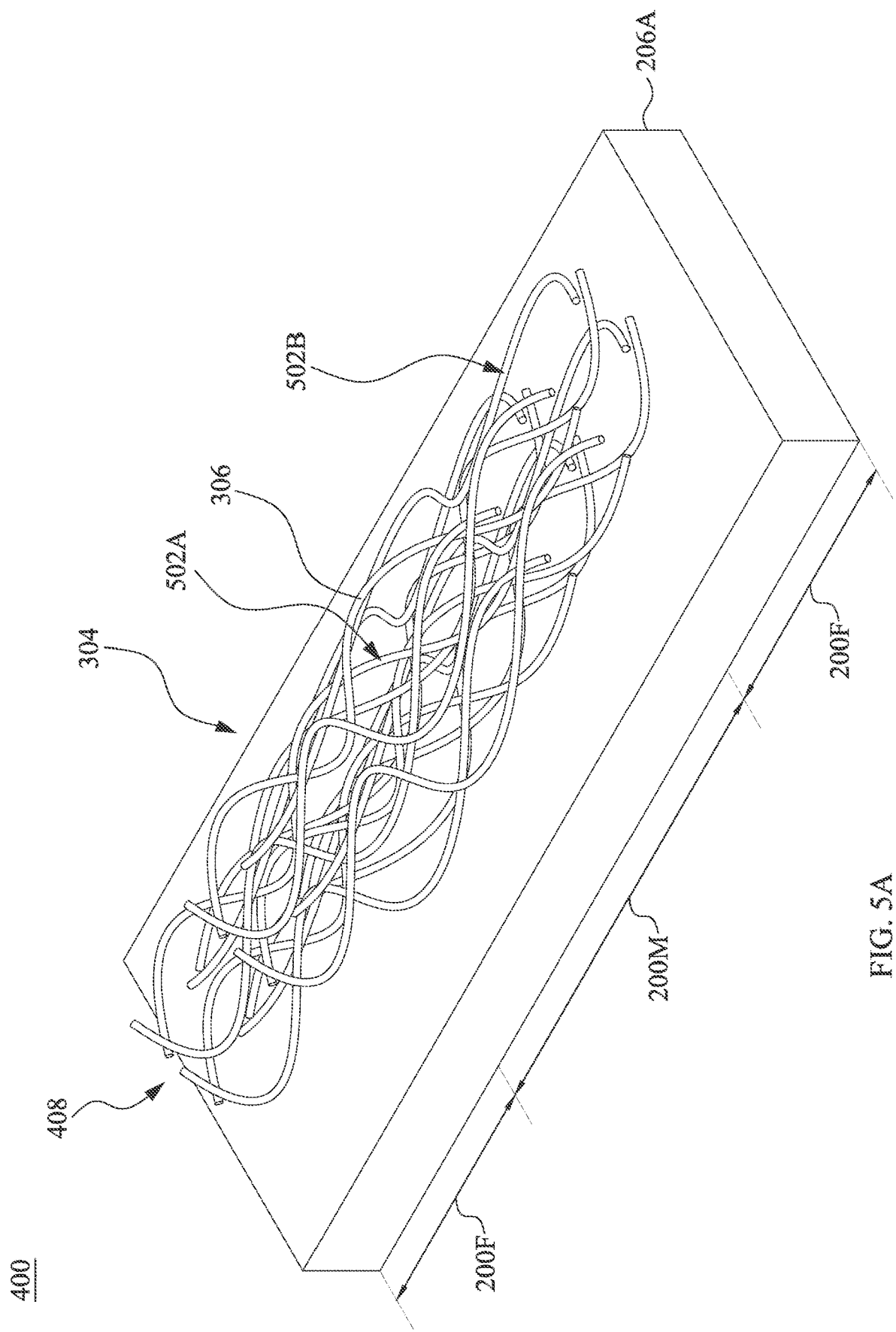
FIGS. 5A, 5B, 5C, 5D, 5E and 5F are perspective views and cross-sectional views of intermediate stages of nanowires of the method shown in FIGS. 4A to 4C, in accordance with some embodiments of the present disclosure.
Figure 5C:
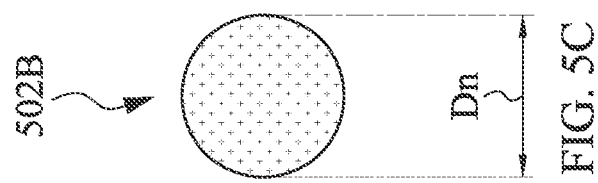

FIG. 4A shows a cross-sectional view of the method of manufacturing the pellicle 400, in which FIG. 4A corresponds to FIG. 2D and follows the procedures shown in FIGS. 2A to 2C. Referring to FIG. 2A and FIG. 4A, a nanowire layer 408 is formed over the upper capping layer 206A. FIG. 5A illustrates a perspective view of the pellicle 400. Referring to FIG. 4A and FIG. 5A, the nanowire layer 408 is different from the nanowire layer 208 in that the nanowire layer 408 includes nanowires 502, e.g., exemplary nanowires 502A and 502B, in which the nanowires 502 are formed of metal-containing compound. In some embodiments, the nanowires 502 include molybdenum silicon nitride, boron carbide, zirconia nitride, zirconia carbide or boron silicon nitride. The metallic elements of the nanowires 502 may aid in dissipating heat of the nanowires 502 during the EUV photolithography operation. As a result, the additional thermal conductive layer 308 formed in the nanowire 302 may be omitted.

Figure 5B:
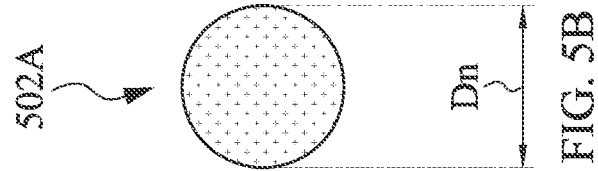
Figure 5D:
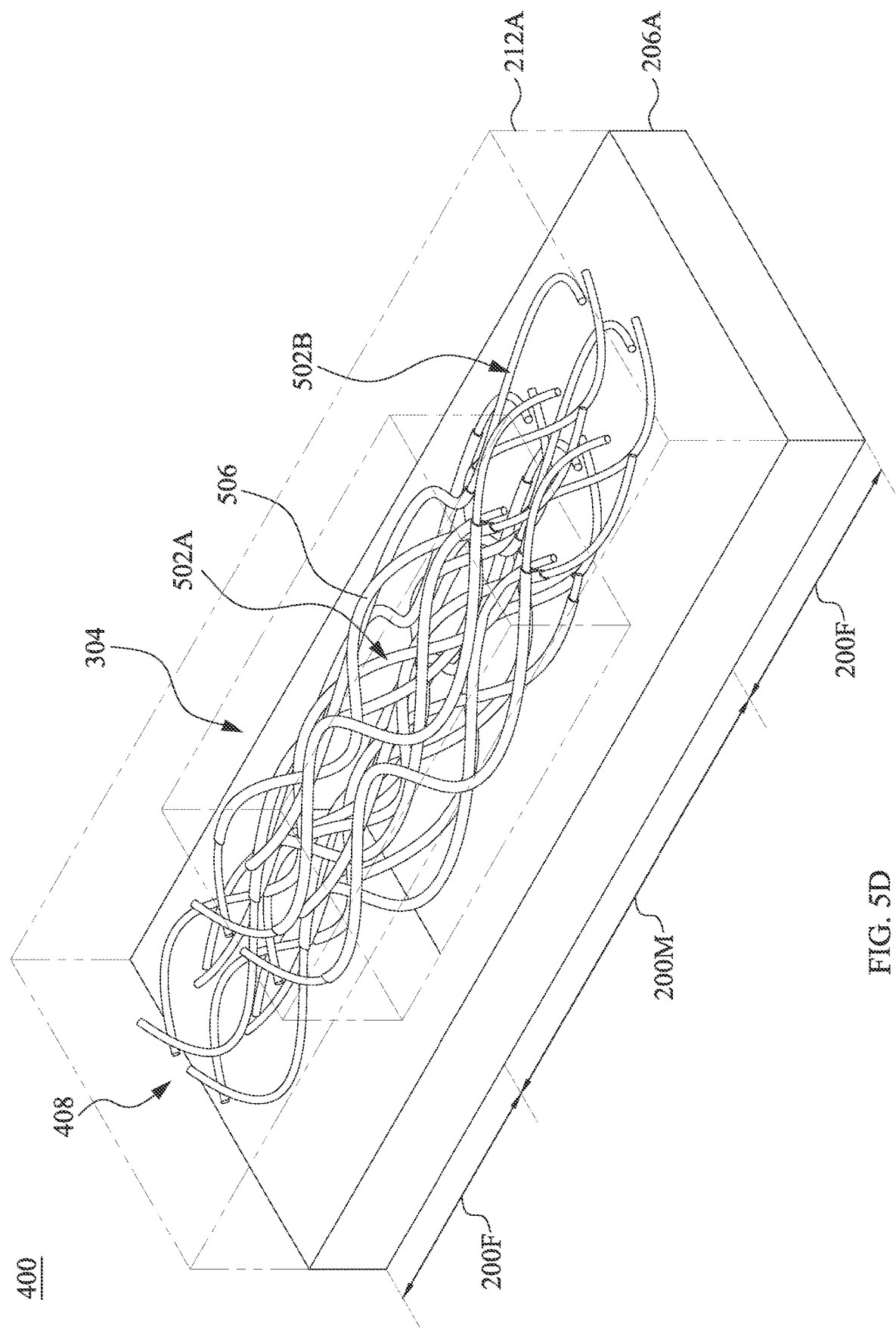
Figure 5F:
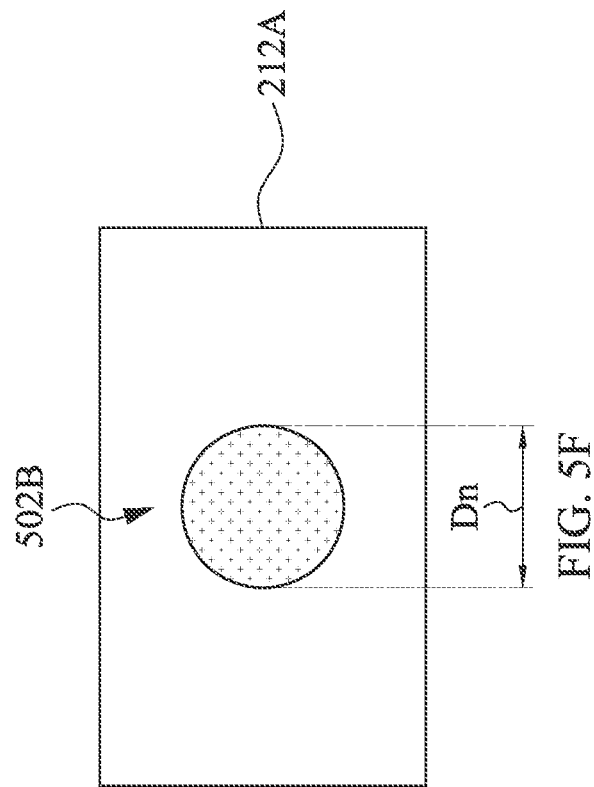
Figure 5E:
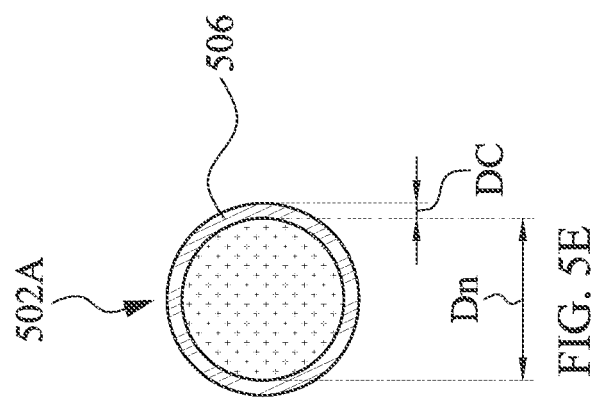

FIG. 4B illustrates the formation of the membrane of the pellicle 400, and corresponds to FIG. 2J for forming the membrane of the pellicle 200. The steps between FIG. 4A and FIG. 4B follow the steps shown in FIGS. 2E to 2I, and descriptions of these similar steps are omitted for brevity. FIG. 5B illustrates a perspective view of the pellicle 400 corresponding to FIG. 4B. Referring to FIG. 4B and FIG. 5B, a patterning operation is performed to etch excess portions of the upper capping layers 212A to form a coating 506 on the nanowires 502A within the main region 200M for preventing the nanowires 502A from being damaged by the contaminant-cleaning gas. Gaps 504 of the nanowire layer 408 are also formed through the patterning operation. The method and configuration of the patterning operation shown in FIG. 4B and FIG. 5B are similar to those described with reference to FIG. 2J and FIG. 3C, and descriptions thereof are omitted for brevity.

FIG. 4C shows the removal of the mask layer 216 and corresponds to FIG. 2L. The method and configuration of the removal operation shown in FIG. 4C are similar to those described with reference to FIG. 2L, and descriptions thereof are omitted for brevity.

Figure 6:
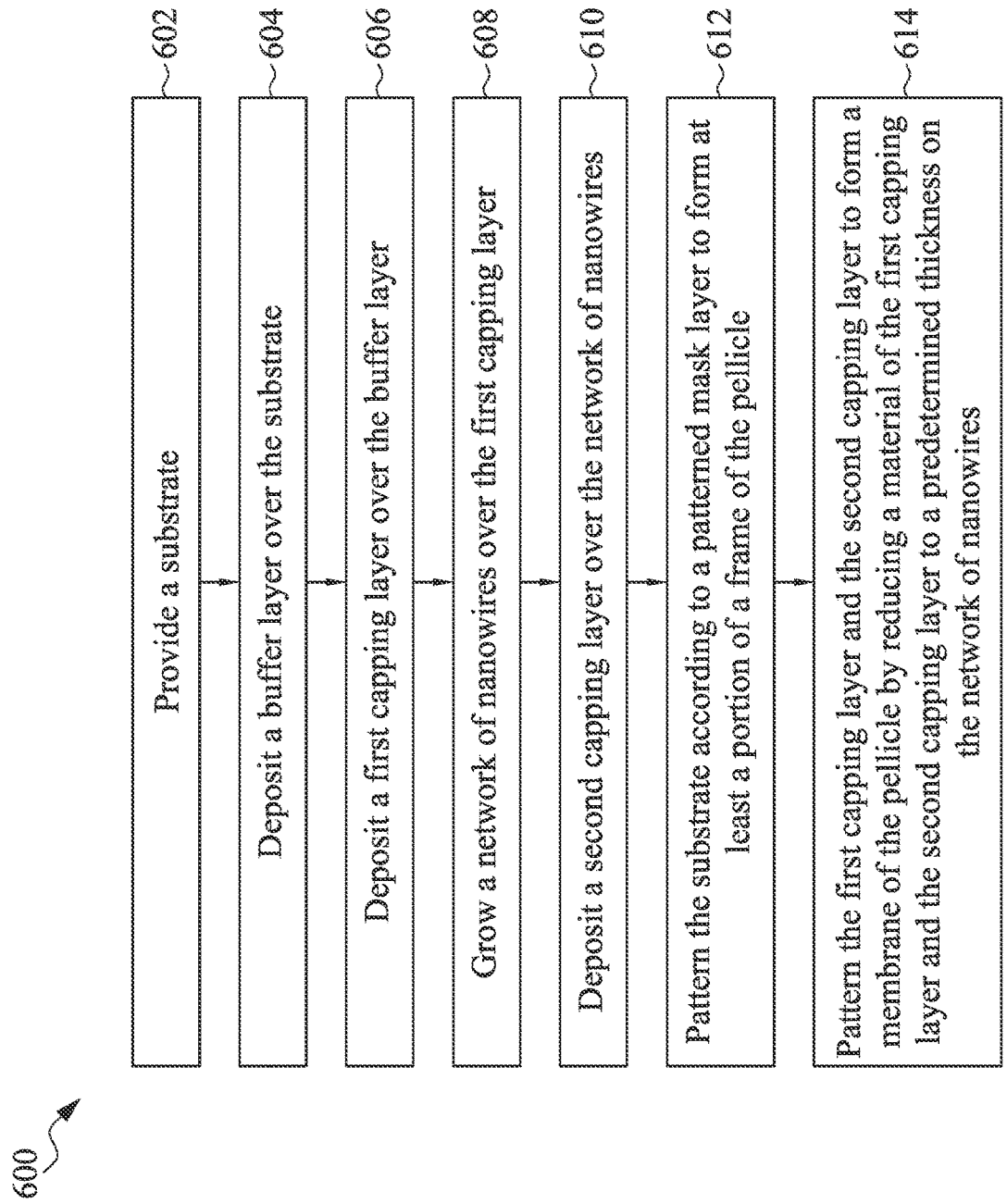
FIG. 6 is a flowchart of a method of manufacturing a photomask pellicle, in accordance with some embodiments of the present disclosure.

FIG. 6 is a flowchart of a method 600 of manufacturing a photomask pellicle, in accordance with some embodiments of the present disclosure. It should be understood that additional operations can be provided before, during, and after the various steps shown in FIG. 6, and some of the operations described below can be replaced or eliminated, for additional embodiments of the method 600.

At step 602, a substrate is provided. At step 604, a buffer layer is deposited over the substrate. At step 606, a first capping layer is deposited over the buffer layer. At step 608, a network of nanowires is grown over the first capping layer.

At step 610, a second capping layer is deposited over the network of nanowires. At step 612, the substrate is patterned according to a patterned mask layer to form at least a portion of a frame of the pellicle. The patterning of the substrate may include an etching operation.

At step 614, the first capping layer and the second capping layer are patterned to form a membrane of the pellicle by reducing a material of the first capping layer and the second capping layer to a predetermined thickness on the network of nanowires. The patterning of the first capping layer and the second capping layer may include an etching operation to form a coating on the nanowires. In some embodiments, the patterning of the first capping layer and the second capping layer forms the coating on a first portion of the nanowires and keeps a second portion of the nanowires encapsulated by the first capping layer and the second capping layer.

Figure 7:
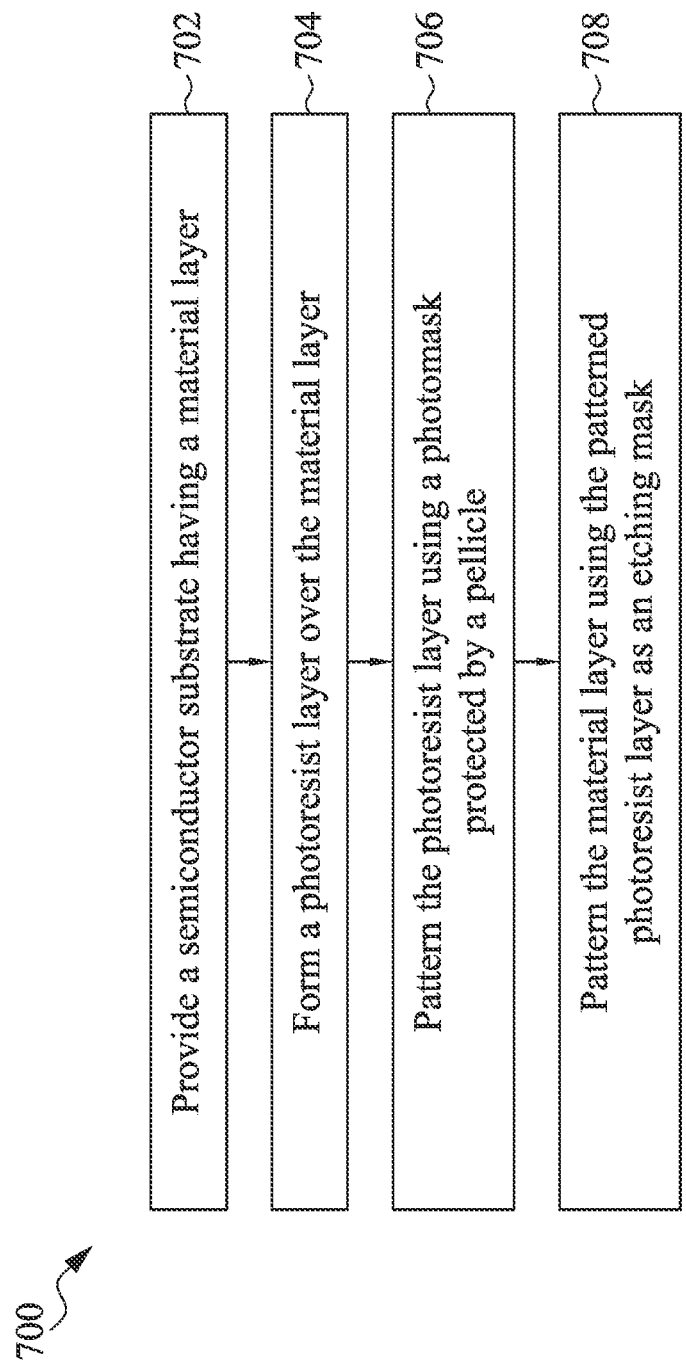
FIG. 7 is a flowchart of a method of forming a semiconductor device, in accordance with some embodiments of the present disclosure.

FIG. 7 is a flowchart of a method 700 of forming a semiconductor device, in accordance with some embodiments of the present disclosure. It should be understood that additional operations can be provided before, during, and after the various steps shown in FIG. 7, and some of the operations described below can be replaced or eliminated, for additional embodiments of the method 700.

The semiconductor device may be manufactured using a photomask, such as the photomask 108 described in relation to FIG. 1. The photomask is protected by a pellicle, such as the pellicles 128, 200 and 400. The method 700 begins at step 702, wherein a semiconductor substrate having a material layer is provided. The semiconductor substrate includes a semiconductor material such as silicon. In some embodiments, the semiconductor substrate may include other semiconductor materials, such as silicon germanium, silicon carbide, gallium arsenide, or the like. In some embodiments, the semiconductor substrate is a p-type semiconductive substrate (acceptor type) or n-type semiconductive substrate (donor type). Alternatively, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate is a semiconductor-on-insulator (SOI) substrate. In other alternatives, the semiconductor substrate may include a doped epitaxial layer, a gradient semiconductor layer, and/or a semiconductor layer overlaying another semiconductor layer of a different type, such as a silicon layer on a silicon germanium layer.

In some embodiments, the material layer may be a semiconductor layer, a dielectric layer or a conductive layer. In some embodiments, the material layer may be embedded in the semiconductor substrate or deposited over the semiconductor substrate. The material layer may be formed of a single layer or may include a multilayer structure.

At step 704, a photoresist layer is formed over the material layer. The photoresist layer may be formed over the material layer by CVD, PVD, ALD, spin-on coating, or other suitable film-forming method. Next, the method 700 continues with step 706, in which the photoresist layer is patterned using a photomask, such as the EUV photomask 108 as described above, in a lithography operation. The photomask is protected by a pellicle. In an embodiment, the photomask may be disposed on a reticle stage of a lithography system and the semiconductor substrate is disposed on a substrate stage. The lithography operation may involve projection of a patterned exposure radiation onto the photoresist layer through transmission or reflection of the photomask 108. Portions of the photoresist layer may be removed after the lithography operation.

The method 700 continues with step 708 to pattern the material layer using the patterned photoresist layer as an etch mask. Next, the photoresist layer is removed. The removal operations may include an etching or ashing operation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

According to an embodiment, a method is provided. A first capping layer is deposited over a substrate. A network of nanowires is grown over the first capping layer. A second capping layer is deposited over the network of nanowires. The substrate is etched to expose the first capping layer. The first capping layer and the second capping layer are thinned around the nanowires to form a coating on the nanowires.

According to an embodiment, a method is provided. A first capping layer is deposited over a substrate. A network of nanowires is grown over the first capping layer. A second capping layer is deposited over the network of nanowires, wherein the first capping layer and the second capping layer encapsulate the nanowires. The first capping layer and the second capping layer are etched to form a coating, from the first capping layer and the second capping layer, on a first portion of the nanowires. A plurality of gaps are formed between the nanowires.

According to an embodiment, a photomask pellicle includes a frame defining an interior space and a membrane coupled to the frame. The membrane includes a network of nanowires, wherein the nanowires cross each other, and a protection material formed on the network of nanowires. The protection material includes a first portion serving as the frame to encapsulate the network of nanowires, and a second portion within the interior space. The protection material forms a coating on the network of nanowires and conformal to a circumference of each of the nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a first capping layer over a substrate;
   growing a network of nanowires over the first capping layer;
   depositing a second capping layer over the network of nanowires;
   etching the substrate to expose the first capping layer; and
   thinning the first capping layer and the second capping layer around the nanowires to form a coating on the nanowires.

2. The method of claim 1, wherein the nanowires comprise carbon, molybdenum silicide, molybdenum silicon nitride, boron carbide or boron nitride.

3. The method of claim 1, wherein the first capping layer or the second capping layer comprises silicon nitride, silicon oxide, silicon carbide, zirconium nitride or zirconium oxide.

4. The method of claim 1, further comprising depositing a thermal conductive layer prior to the depositing of the second capping layer or subsequent to the depositing of the second capping layer.

5. The method of claim 4, wherein the thermal conductive layer comprises molybdenum silicon nitride or boron silicon nitride.

6. The method of claim 5, wherein a portion of the coating is exposed through the thermal conductive layer.

7. The method of claim 1, wherein a ratio of a diameter of the nanowires to a thickness of the coating is between about 1 and about 10.

8. The method of claim 1, wherein the thinning forms a membrane, a frame surrounding the membrane and a plurality of gaps in the membrane, and configures the membrane as a free-standing structure anchored at the frame.

9. The method of claim 8, wherein the first capping layer or the second capping layer is configured to exert tensile stress on the membrane.

10. The method of claim 1, further comprising depositing a mask layer on a side of the substrate opposite to the first capping layer, wherein the etching of the substrate comprises etching the substrate using the mask layer as an etching mask.

11. The method of claim 1, further comprising depositing a buffer layer over the substrate prior to the depositing of the first capping layer.

12. The method of claim 11, wherein the etching of the substrate comprises etching the buffer layer to expose the first capping layer.

13. A method, comprising:
depositing a first capping layer over a substrate;
growing a network of nanowires over the first capping layer;
depositing a second capping layer over the network of nanowires, wherein the first capping layer and the second capping layer encapsulate the nanowires; and
etching the first capping layer and the second capping layer to form a coating, from the first capping layer and the second capping layer, on a first portion of the nanowires, wherein a plurality of gaps is formed between the nanowires.

14. The method of claim 13, wherein the depositing of the first capping layer comprises depositing a third capping layer on a side the substrate opposite to the first capping layer.

15. The method of claim 14, further comprising etching the third capping layer.

16. The method of claim 13, further comprising:
depositing two buffer layers on two sides of the substrate prior to the depositing of the first capping layer; and
etching the two buffer layers according to a patterned mask layer.

17. A photomask pellicle, comprising:
a frame defining an interior space; and
a membrane coupled to the frame and comprising:
 a network of nanowires, wherein the nanowires cross each other; and
 a protection material formed on the network of nanowires, wherein the protection material comprises:
  a first portion serving as the frame to encapsulate the network of nanowires; and
  a second portion within the interior space, wherein the protection material forms a coating on the network of nanowires and conformal to a circumference of each of the nanowires.

18. The photomask pellicle of claim 17, wherein the nanowires comprise carbon, molybdenum silicide, boron carbide or boron nitride.

19. The photomask pellicle of claim 17, wherein the coating comprises silicon nitride, silicon oxide, silicon carbide, zirconium nitride or zirconium oxide.

20. The photomask pellicle of claim 17, further comprising a thermal conductive layer on the coating.

* * * * *